US012592677B2

(12) United States Patent
Ouchi

(10) Patent No.: US 12,592,677 B2
(45) Date of Patent: Mar. 31, 2026

(54) ACOUSTIC WAVE DEVICE

(71) Applicant: Murata Manufacturing Co., Ltd., Nagaokakyo (JP)

(72) Inventor: Minefumi Ouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 336 days.

(21) Appl. No.: 18/195,430

(22) Filed: May 10, 2023

(65) Prior Publication Data

US 2023/0275564 A1 Aug. 31, 2023

Related U.S. Application Data

(63) Continuation of application No. PCT/JP2021/041207, filed on Nov. 9, 2021.

(Continued)

(51) Int. Cl.
*H03H 9/25* (2006.01)
*H03H 9/02* (2006.01)
(Continued)

(52) U.S. Cl.
CPC .......... *H03H 9/25* (2013.01); *H03H 9/02007* (2013.01); *H03H 9/02228* (2013.01);
(Continued)

(58) Field of Classification Search
CPC .......... H03H 9/14541; H03H 9/02007; H03H 9/02574; H03H 9/173; H03H 9/25;
(Continued)

(56) References Cited

U.S. PATENT DOCUMENTS 10,491,192 B1 11/2019 Plesski et al.
2013/0057360 A1 3/2013 Meltaus et al.
(Continued)

FOREIGN PATENT DOCUMENTS

JP 2002151996 A * 5/2002
JP 2010220204 A 9/2010
(Continued)

OTHER PUBLICATIONS

International Search Report in PCT/JP2021/041207, mailed Jan. 11, 2022, 4 pages.
(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device includes a piezoelectric layer including first and second main surfaces facing each other, an IDT electrode on the first main surface and including first and second busbars facing each other and electrode fingers, a first conductor on the second main surface and facing the first busbar with the piezoelectric layer therebetween, and a support on the second main surface and supporting the piezoelectric layer. A cavity that opens towards the piezoelectric layer is provided in the support, and the first conductor is positioned inside the cavity. An electric potential of the first conductor is different from an electric potential to which the first busbar is connected.

24 Claims, 14 Drawing Sheets

Related U.S. Application Data

(60) Provisional application No. 63/112,245, filed on Nov. 11, 2020.

(51) Int. Cl.
    *H03H 9/145*       (2006.01)
    *H03H 9/17*        (2006.01)

(52) U.S. Cl.
    CPC .... *H03H 9/02574* (2013.01); *H03H 9/14541*
             (2013.01); *H03H 9/173* (2013.01)

(58) Field of Classification Search
    CPC ....... H03H 2003/021; H03H 2003/023; H03H
             2003/025; H03H 9/02062; H03H 9/174;
             H03H 9/175; H03H 9/542; H03H
                    9/02228; H03H 3/02
    USPC .......................... 310/311, 324; 333/186, 187
    See application file for complete search history.

(56) References Cited

U.S. PATENT DOCUMENTS

| | | |
|---|---|---|
| 2014/0145556 A1 | 5/2014 | Kadota |
| 2014/0152145 A1 | 6/2014 | Kando et al. |
| 2017/0214381 A1 | 7/2017 | Bhattacharjee |
| 2019/0386633 A1* | 12/2019 | Plesski .................... H03H 9/54 |

FOREIGN PATENT DOCUMENTS

| | | |
|---|---|---|
| JP | 2013528996 A | 7/2013 |
| WO | 2012073871 A1 | 6/2012 |
| WO | 2013021948 A1 | 2/2013 |
| WO | 2017077892 A1 | 5/2017 |

OTHER PUBLICATIONS

Written Opinion in PCT/JP2021/041207, mailed Jan. 11, 2022, 4 pages.

* cited by examiner

FIG. 5
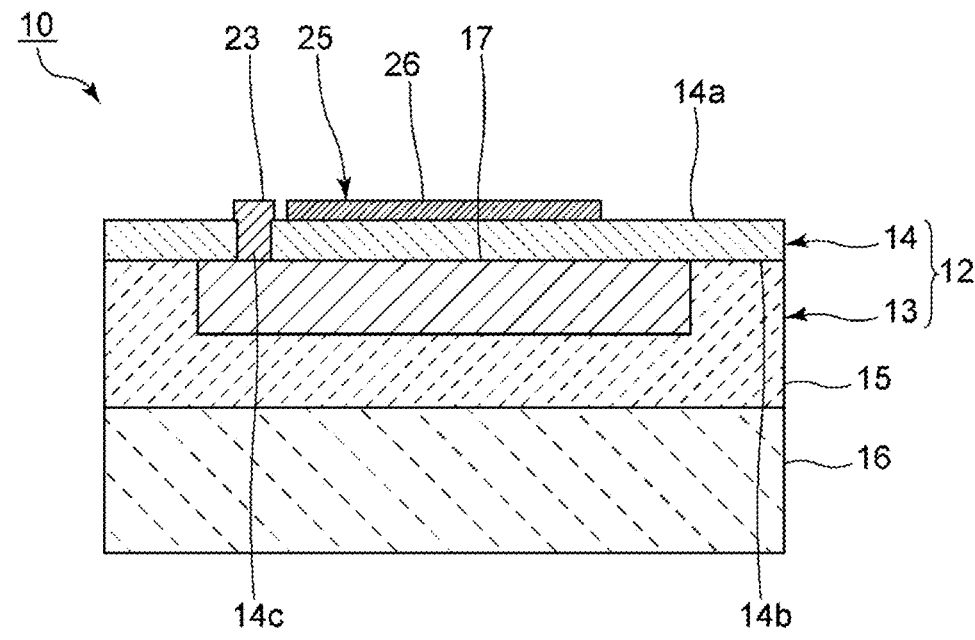
FIG. 6A
FIG. 6B
FIG. 6C
FIG. 6D
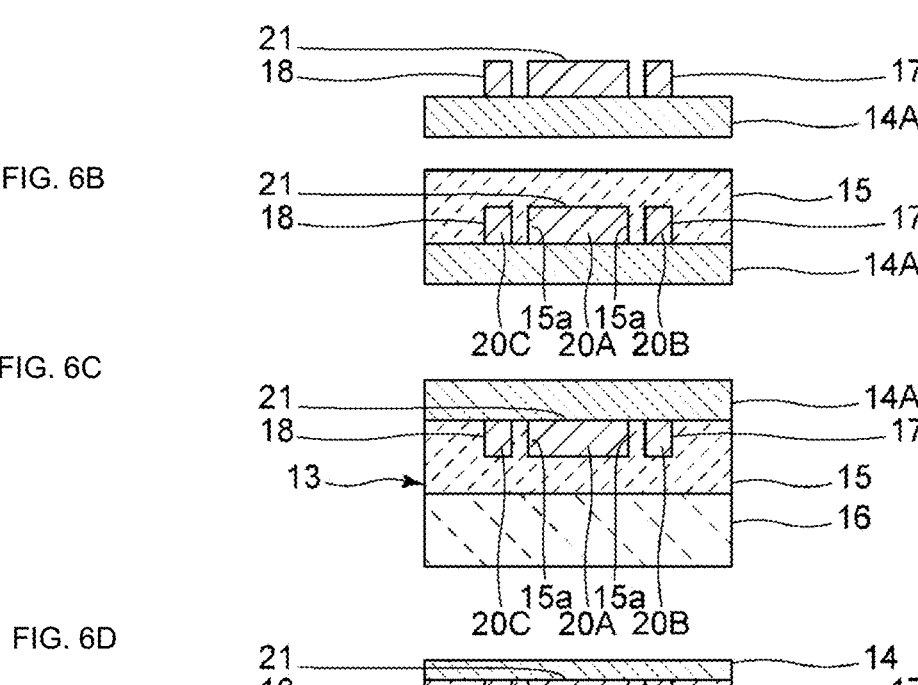

FORMULA (2) REGION

FORMULA (1) REGION

FORMULA (3) REGION

FORMULA (2) REGION

ACOUSTIC WAVE DEVICE

CROSS REFERENCE TO RELATED APPLICATIONS

This application claims the benefit of priority to Provisional Application No. 63/112,245 filed on Nov. 11, 2020 and is a Continuation Application of PCT Application No. PCT/JP2021/041207 filed on Nov. 9, 2021. The entire contents of each application are hereby incorporated herein by reference.

BACKGROUND OF THE INVENTION

1. Field of the Invention

The present invention relates to an acoustic wave device.

2. Description of the Related Art

Heretofore, acoustic wave devices have been widely used in filters of mobile phone devices and so forth. In recent years, acoustic wave devices using thickness-shear mode bulk waves have been disclosed such as that described in U.S. Pat. No. 10,491,192. In this acoustic wave device, a pair of electrodes are provided on a piezoelectric layer. The pair of electrodes face each other on the piezoelectric layer and are connected to different electric potentials. Thickness-shear mode bulk waves are excited by applying an AC voltage between the electrodes.

On the other hand, in International Publication No. 2013/021948, an example of an acoustic wave device that uses plate waves is disclosed. In this acoustic wave device, a $LiNbO_3$ substrate serving as a piezoelectric layer is provided on a support. An interdigital transducer (IDT) electrode is provided on the $LiNbO_3$ substrate.

In acoustic wave devices such as those described in U.S. Pat. No. 10,491,192 and International Publication No. 2013/021948, wiring lines or the like may be formed in order to provide additional capacitances when adjusting the frequency characteristics or relative bandwidth. When such wiring lines or the like are formed on the surface of the piezoelectric layer where a functional electrode such as an IDT electrode is provided, the area of the piezoelectric layer tends to be large. Therefore, the acoustic wave device may be large in size.

SUMMARY OF THE INVENTION

Preferred embodiments of the present invention provide acoustic wave devices that each enable the frequency characteristics and relative bandwidth to be easily adjusted without increasing the size of the device.

An acoustic wave device according to a preferred embodiment of the present invention includes a piezoelectric layer including a first main surface and a second main surface that face each other, an IDT electrode on the first main surface of the piezoelectric layer and including a first busbar and a second busbar that face each other, and a plurality of electrode fingers, a conductor on the second main surface of the piezoelectric layer and facing the first busbar with the piezoelectric layer interposed therebetween, and a support on the second main surface of the piezoelectric layer and supporting the piezoelectric layer. A cavity that opens towards the piezoelectric layer is provided in the support. The conductor is positioned inside the cavity. An electric potential of the conductor is different from an electric potential to which the first busbar is connected.

In acoustic wave devices according to preferred embodiments of the present invention, the frequency characteristics and relative bandwidth can be easily adjusted without increasing the size of the device.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is a sectional view taken along line III-III in FIG. 1.

FIGS. 6A to 6D are sectional views for describing an example of a method of manufacturing the acoustic wave device according to the First Preferred Embodiment of the present invention and illustrate a portion corresponding to a cross section taken along line II-II in FIG. 1.

DETAILED DESCRIPTION OF THE PREFERRED EMBODIMENTS

Figure 1:
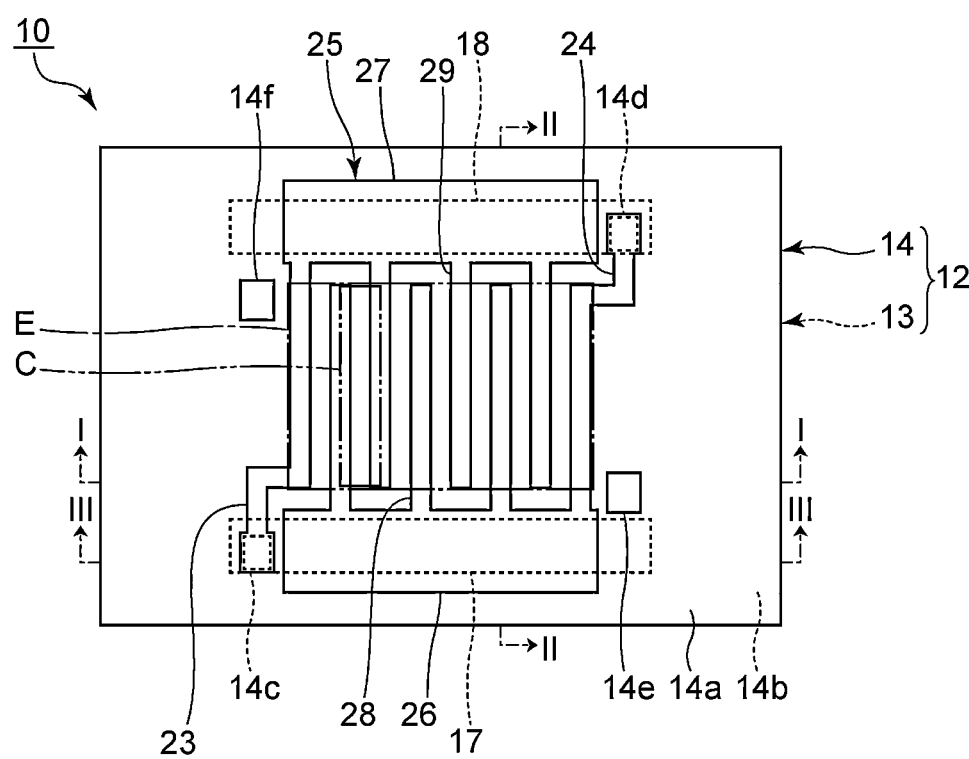
FIG. 1 is a plan view of an acoustic wave device according to a First Preferred Embodiment of the present invention.

Hereafter, the present invention will be made clearer by describing preferred embodiments of the present invention while referring to the drawings.

The preferred embodiments described in the present specification are illustrative examples and portions of the configurations illustrated in different preferred embodiments can be substituted for one another or combined with one another.

Figure 2:
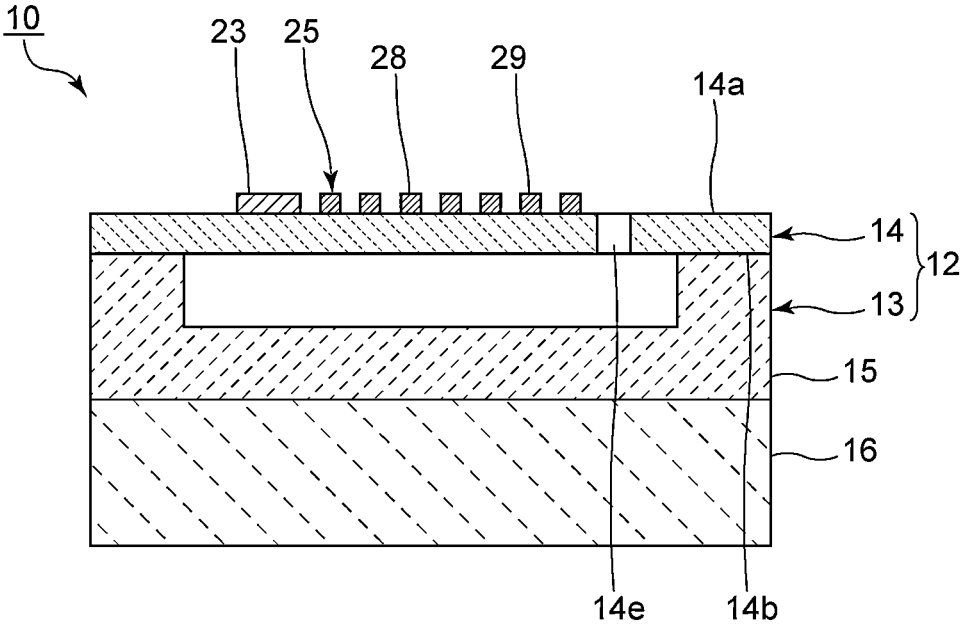
FIG. 2 is a sectional view taken along line I-I in FIG. 1.

FIG. 1 is a plan view of an acoustic wave device according to a First Preferred Embodiment of the present invention. FIG. 2 is a sectional view taken along line I-I in FIG. 1.

As illustrated in FIGS. 1 and 2, an acoustic wave device 10 includes a piezoelectric substrate 12 and an IDT electrode 25. As illustrated in FIG. 2, the piezoelectric substrate 12 includes a support 13 and a piezoelectric layer 14. In the present preferred embodiment, the support 13 includes a support substrate 16 and a dielectric film 15. The dielectric film 15 is provided on the support substrate 16. The piezoelectric layer 14 is provided on the dielectric film 15. However, the support 13 may instead include only the support substrate 16.

The piezoelectric layer 14 includes a first main surface 14*a* and a second main surface 14*b*. The first main surface 14*a* and the second main surface 14*b* face each other. Of the first main surface 14*a* and the second main surface 14*b*, the second main surface 14*b* is the main surface on the side where the support 13 is located. The piezoelectric layer 14 is, for example, a lithium niobate layer in the present preferred embodiment. More specifically, the piezoelectric layer 14 is, for example, a $LiNbO_3$ layer. However, the piezoelectric layer 14 may instead be a lithium tantalate layer such as a $LiTaO_3$ layer, for example.

As illustrated in FIG. 1, the IDT electrode 25 is provided on the first main surface 14*a* of the piezoelectric layer 14. The IDT electrode 25 includes a first busbar 26, a second busbar 27, a plurality of first electrode fingers 28, and a plurality of second electrode fingers 29. The plurality of first electrode fingers 28 are disposed in a periodic manner. First ends of the plurality of first electrode fingers 28 are connected to the first busbar 26. The plurality of second electrode fingers 29 are disposed in a periodic manner. First ends of the plurality of second electrode fingers 29 are connected to the second busbar 27. The plurality of first electrode fingers 28 and the plurality of second electrode fingers 29 are interdigitated with each other.

Here, the first busbar 26 and the second busbar 27 are connected to different electric potentials. Consequently, the first electrode fingers 28 and the second electrode fingers 29 are connected to different electric potentials from each other. More specifically, in the present preferred embodiment, the first busbar 26 and the first electrode fingers 28 are connected to the ground potential. The second busbar 27 and the second electrode fingers 29 are connected to a hot potential. However, the potentials to which the first electrode fingers 28 and the second electrode fingers 29 are connected are not limited to the above potentials. The IDT electrode 25 may include a single-layer metal film or a multilayer metal film.

Hereafter, the first electrode fingers 28 and the second electrode fingers 29 may be simply referred to as electrode fingers. When the direction in which adjacent electrode fingers face each other is referred to as an electrode finger facing direction and the direction in which the plurality of electrode fingers extend is referred to as an electrode finger extending direction, the electrode finger extending direction is perpendicular or substantially perpendicular to the electrode finger facing direction in the present preferred embodiment.

Figure 3:
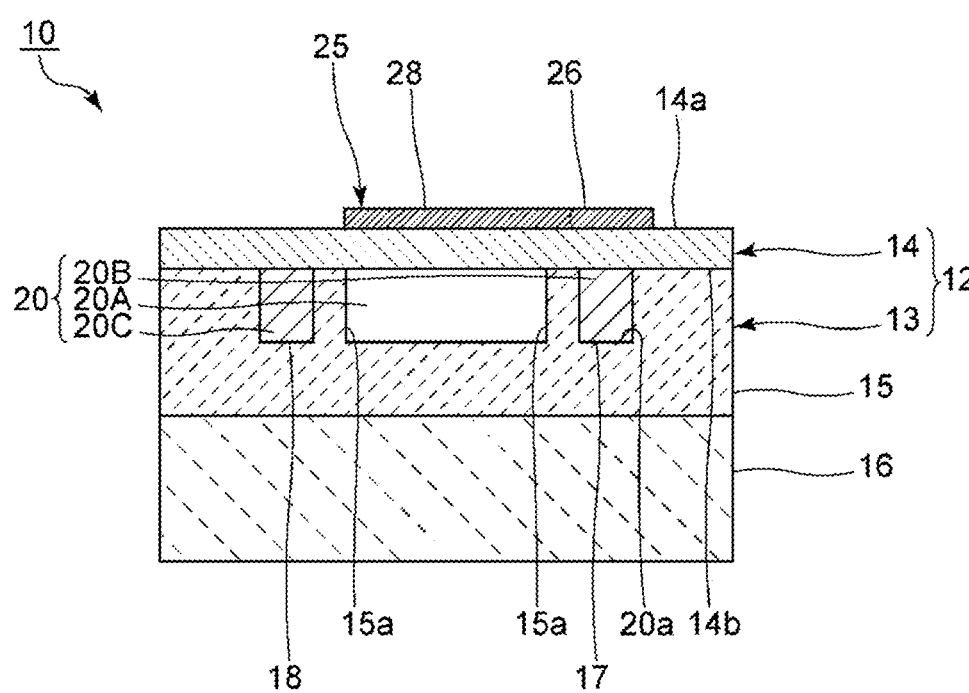
FIG. 3 is a sectional view taken along line II-II in FIG. 1.

FIG. 3 is a sectional view taken along line II-II in FIG. 1.

A cavity 20 is provided in the support 13. In the present preferred embodiment, the cavity 20 is a recess provided in only the dielectric film 15. The cavity 20 overlaps at least a portion of the IDT electrode 25 in plan view. In the present specification, "in plan view" means looking from above in FIG. 1. On the other hand, a bottom view means looking from below in FIG. 1.

More specifically, the cavity 20 includes a central cavity 20A, a first lateral cavity 20B, and a second lateral cavity 20C. The central cavity 20A overlaps the plurality of electrode fingers of the IDT electrode 25 in plan view. The first lateral cavity 20B overlaps the first busbar 26 in plan view. The second lateral cavity 20C overlaps the second busbar 27 in plan view. The dielectric film 15 includes a pair of partitions 15*a*. One partition 15*a* is provided between the central cavity 20A and the first lateral cavity 20B. The other partition 15*a* is provided between the central cavity 20A and the second lateral cavity 20C.

The cavity 20 is open on the side where the piezoelectric layer 14 is located. The piezoelectric layer 14 is provided on the dielectric film 15 so as to close the cavity 20. More specifically, the center cavity 20A, the first lateral cavity 20B, and the second lateral cavity 20C are all closed by the piezoelectric layer 14. The cavity 20 may, for example, be a cavity structured such that the center cavity 20A, the first lateral cavity 20B, and the second lateral cavity 20C are integrated with each other. In other words, the partitions 15a of the dielectric film 15 do not have to be provided.

As described above, the cavity 20 is provided only in the dielectric film 15. Therefore, the center cavity 20A, the first lateral cavity 20B, and the second lateral cavity 20C in the cavity 20 are each a cavity including a bottom 20a. The cavity 20 may be provided in a continuous manner in the dielectric film 15 and the support substrate 16.

Figure 4:
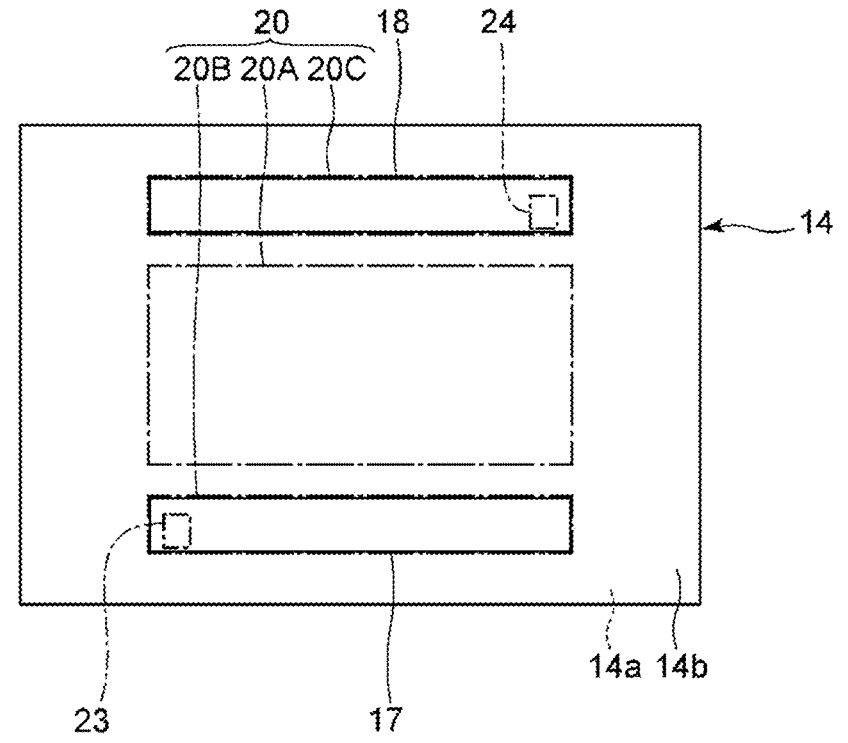
FIG. 4 is a bottom view illustrating the electrode configuration on a second main surface of a piezoelectric layer in the First Preferred Embodiment of the present invention.

FIG. 4 is a bottom view illustrating the electrode configuration on the second main surface of the piezoelectric layer in the First Preferred Embodiment. FIG. 5 is a sectional view taken along line III-III in FIG. 1.

As illustrated in FIG. 4, the second main surface 14b of the piezoelectric layer 14 is provided with a first conductor 17 and a second conductor 18. The first conductor 17, as a conductor, is positioned inside the cavity 20. More specifically, the first conductor 17 is positioned inside the first lateral cavity 20B. The first conductor 17 faces the first busbar 26 with the piezoelectric layer 14 interposed therebetween. In addition, the first conductor 17 contacts the bottom 20a of the first lateral cavity 20B. In the present preferred embodiment, the first conductor 17 fills the entirety or substantially the entirety of the first lateral cavity 20B. However, the first conductor 17 does not have to fill the entirety or substantially the entirety of the first lateral cavity 20B. It is sufficient that the first conductor 17 is provided on the second main surface 14b of the piezoelectric layer 14 and that the first conductor 17 faces the first busbar 26. The phrase "provided on the second main surface 14b" used here includes a case where the member is directly provided on the second main surface 14b and a case where the member is indirectly provided on the second main surface 14b.

Returning to FIG. 1, the piezoelectric layer 14 is provided with a first through hole 14c and a second through hole 14d, and a first through aperture 14e and a second through aperture 14f. As illustrated in FIG. 5, a first lead-out wiring line 23 is provided inside the first through hole 14c. The first lead-out wiring line 23 is connected to the first conductor 17. The first lead-out wiring line 23 extends through the first through hole 14c and is also provided on the first main surface 14a. As illustrated in FIG. 1, the first lead-out wiring line 23 is connected to one second electrode finger 29. More specifically, the first lead-out wiring line 23 is connected to the second electrode finger 29 that is positioned nearest to the first through hole 14c in the electrode finger facing direction. As described above, the second electrode fingers 29 are connected to the second busbar 27. Thus, the first conductor 17 is electrically connected to the second busbar 27. However, the first conductor 17 does not necessarily have to be electrically connected to the second busbar 27.

On the other hand, the first through aperture 14e and the second through aperture 14f are used to define the central cavity 20A. No electrodes are provided inside the first through aperture 14e or the second through aperture 14f. The first through hole 14c and second through hole 14d and the first through aperture 14e and the second through aperture 14f are configured in the same or substantially the same manner. The shape and area in plan view of each through hole and each through aperture may be different.

A feature of the present preferred embodiment is that the first conductor 17 positioned inside the cavity 20 faces the first busbar 26 with the piezoelectric layer 14 interposed therebetween, and the potential of the first conductor 17 is different from the potential to which the first busbar 26 is connected. More specifically, in the present preferred embodiment, the first conductor 17 is connected to a hot potential. The first busbar 26 is connected to the ground potential. Thus, a capacitance element is defined by the first conductor 17, the first busbar 26, and the piezoelectric layer 14. The frequency characteristics and relative bandwidth can be easily adjusted by adjusting the capacitance of the capacitance element. In addition, the first conductor 17 is provided inside the cavity 20. Therefore, there is no need to increase the area of the piezoelectric layer 14. Therefore, the frequency characteristics and relative bandwidth can be easily adjusted without increasing the size of the acoustic wave device 10. The capacitance of the capacitance element may be adjusted by adjusting the facing area of the first conductor 17 and the first busbar 26, for example.

Hereafter, more detailed and preferred configurations of the present preferred embodiment are described.

In the IDT electrode 25, the region where adjacent electrode fingers overlap each other when viewed in the electrode finger facing direction is referred to as a crossing region E. The crossing region E is the region of the IDT electrode 25 extending from the electrode finger at one end in the electrode finger facing direction to the electrode finger at the other end in the electrode finger facing direction. More specifically, the crossing region E extends from an outer edge portion of the electrode finger at one end in the electrode finger facing direction to an outer edge portion of the electrode finger at the other end in the electrode finger facing direction. The acoustic wave device 10 further includes a plurality of excitation regions C. Similarly to the crossing region E, the excitation regions C are regions where adjacent electrode fingers overlap when viewed in the electrode finger facing direction. Each excitation region C is the region between a pair of electrode fingers. More specifically, each excitation region C is the region from the center of one electrode finger in the electrode finger facing direction to the center of another electrode finger in the electrode finger facing direction. Thus, the crossing region E includes a plurality of excitation regions C.

Acoustic waves are excited in the plurality of excitation regions C by applying an AC voltage to the IDT electrode 25. In the present preferred embodiment, the acoustic wave device 10 is configured to use thickness-shear mode bulk waves such as a thickness-shear first-order mode. The acoustic wave device 10 may be configured to use of plate waves. When the acoustic wave device 10 uses plate waves, the crossing region E defines and functions as the excitation region.

The first conductor 17 is electrically connected to the outside via a first lead-out electrode 23, the relevant second electrode finger 29, and the second busbar 27. However, the first lead-out electrode 23 and the first through hole 14c do not necessarily have to be provided. The first conductor 17 may be a floating electrode. In this specification, a "floating electrode" refers to an electrode that is not connected to the hot potential or the ground potential. In this case, the first busbar 26 is preferably connected to the hot potential. This allows the potential of the first conductor 17, which is a floating electrode, to be more reliably made different from the potential to which the first busbar 26 is connected. Thus, a capacitance element is more reliably formed by the first conductor 17, the first busbar 26, and the piezoelectric layer 14.

The first conductor 17 is preferably connected to the first lead-out wiring line 23 as in the present preferred embodiment. As a result, heat inside the cavity 20 can be suitably allowed to propagate to the outside via the first conductor 17 and the first lead-out wiring line 23. More specifically, when acoustic waves are excited, heat is generated in the excitation regions C. Heat propagates from the excitation regions C to the central cavity 20A. However, heat does not tend to propagate to the outside from the central cavity 20A. However, heat does propagate from the central cavity 20A to the first lateral cavity 20B through the partition 15A. This heat can be allowed to propagate to outside the cavity 20 via the first conductor 17 and the first lead-out wiring line 23. Thus, heat dissipation can be improved.

It is more preferable that the first lead-out wiring line 23 is connected to the relevant second electrode finger 29. The second electrode fingers 29 are connected to the second busbar 27. In addition, the second busbar 27 is connected to the outside via wiring lines or the like. Thus, heat inside the cavity 20 can be allowed to propagate to the outside via the first conductor 17, the first lead-out wiring line 23, the relevant second electrode finger 29, and the second busbar 27. Therefore, heat dissipation can be effectively improved.

The acoustic wave device 10 of the present preferred embodiment is configured to utilize thickness-shear mode bulk waves. In this case, the energy of the acoustic waves is highest at the centers of the excitation regions C. On the other hand, the energy of the acoustic waves is low in the portions of the piezoelectric layer 14 where the electrode fingers are provided. Therefore, even though the first lead-out wiring line 23 is connected to the relevant second electrode finger 29, the electrical characteristics of the acoustic wave device 10 are not easily degraded. Therefore, the above configuration is particularly suitable when thickness-shear mode bulk waves are used.

However, when the acoustic wave device 10 is configured to use plate waves, the energy of the acoustic waves is highest near the center of the crossing region E, and the energy is lower at the end portions of the crossing region E. Therefore, when plate waves are used, the effect on the electrical characteristics of the acoustic wave device 10 is small if the first lead-out wiring line 23 is connected to the second electrode finger 29 that is nearest the first through hole 14c.

As illustrated in FIG. 4, the second conductor 18 is provided on the second main surface 14b of the piezoelectric layer 14. More specifically, the second conductor 18 is positioned inside the second lateral cavity 20C of the cavity 20. The second conductor 18 faces the second busbar 27 with the piezoelectric layer 14 interposed therebetween. In addition, the second conductor 18 contacts the bottom 20a of the second lateral cavity 20C. In the present preferred embodiment, the second conductor 18 fills the entirety or substantially the entirety of the second lateral cavity 20C. However, the second conductor 18 does not have to fill the entirety or substantially the entirety of the second lateral cavity 20C. It is sufficient that the second conductor 18 is provided on the second main surface 14b of the piezoelectric layer 14 and that the second conductor 18 face the second busbar 27. The phrase "provided on the second main surface 14b" used herein includes a case where the member is directly provided on the second main surface 14b and a case where the member is indirectly provided on the second main surface 14b. The second conductor 18 does not necessarily have to be provided.

A second lead-out wiring line 24 is provided inside the second through hole 14d. The second lead-out wiring line 24 is connected to the second conductor 18. The second lead-out wiring line 24 extends through the second through hole 14d and is also provided on the first main surface 14a. The second lead-out wiring line 24 is connected to one first electrode finger 28. More specifically, the second lead-out wiring line 24 is connected to the first electrode finger 28 that is positioned nearest the second through hole 14d in the electrode finger facing direction. As described above, the first electrode fingers 28 are connected to the first busbar 26. Thus, the second conductor 18 is electrically connected to the first busbar 26.

The potential of the second conductor 18 is different from the potential to which the second busbar 27 is connected. In the acoustic wave device 10, the second conductor 18 is connected to the ground potential. The second busbar 27 is connected to the hot potential. Thus, a capacitance element is defined by the second conductor 18, the second busbar 27, and the piezoelectric layer 14. Thus, the capacitances of this capacitance element, and the capacitive element defined by the first conductor 17, the first busbar 26, and the piezoelectric layer 14, can be adjusted. Thus, the frequency characteristics and relative bandwidth can be adjusted more reliably and easily. In addition, the second conductor 18 is provided inside the cavity 20. Therefore, there is no need to increase the area of the piezoelectric layer 14.

The second conductor 18 is preferably connected to the second lead-out wiring line 24 as described above. Heat in the central cavity 20A propagates not only to the first lateral cavity 20B but also to the second lateral cavity 20C. This heat can be allowed to propagate to outside the cavity 20 via the second conductor 18 and the second lead-out wiring line 24. It is more preferable that the second lead-out wiring line 24 is connected to the relevant first electrode finger 28. Thus, heat inside the cavity 20 can be allowed to propagate to the outside via the second conductor 18, the second lead-out wiring line 24, the relevant first electrode finger 28, and the first busbar 26. Therefore, heat dissipation can be effectively improved. However, the second conductor 18 does not necessarily have to be electrically connected to the first busbar 26. The second through hole 14d and the second lead-out wiring line 24 do not have to be provided.

Hereafter, a non-limiting example of a method of manufacturing the acoustic wave device 10 of the present preferred embodiment will be described.

Figure 7A:
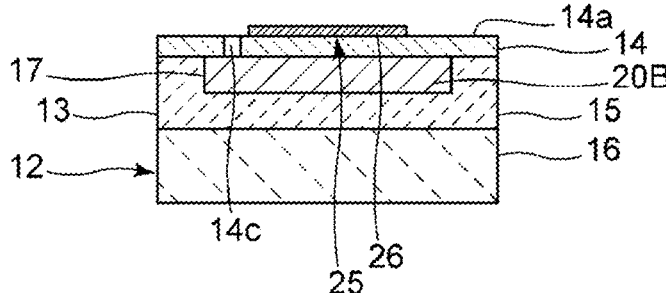
FIGS. 7A and 7B are sectional views for describing an example of a method of manufacturing the acoustic wave device according to the First Preferred Embodiment of the present invention and illustrate a portion corresponding to a cross section taken along line III-III in FIG. 1.
Figure 7B:
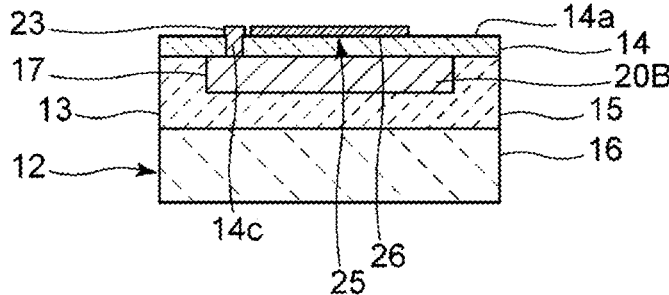
Figure 8A:
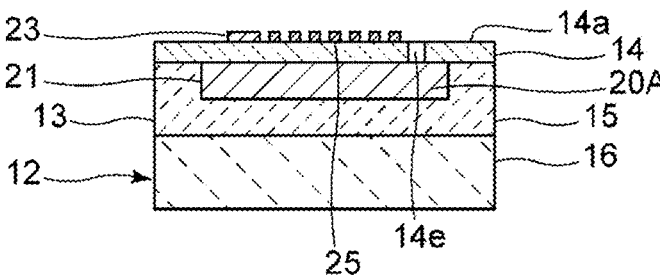
FIGS. 8A and 8B are sectional views for describing an example of a method of manufacturing the acoustic wave device according to the First Preferred Embodiment of the present invention and illustrate a portion corresponding to a cross section taken along line I-I in FIG. 1.
Figure 8B:
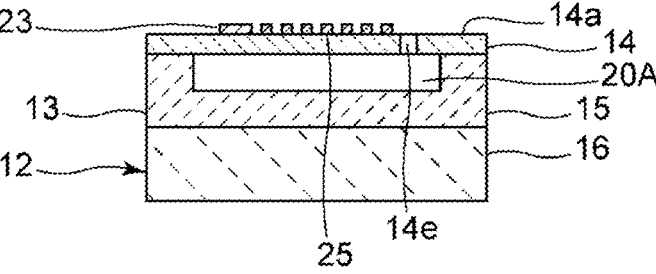

FIGS. 6A to 6D are sectional views for describing an example of a method of manufacturing the acoustic wave device according to the First Preferred Embodiment and illustrate a portion corresponding to a cross section taken along line II-II in FIG. 1. FIGS. 7A and 7B are sectional views for describing an example of a method of manufacturing the acoustic wave device according to the First Preferred Embodiment and illustrate a portion corresponding to a cross section taken along line III-III in FIG. 1. FIGS. 8A and 8B are sectional views for describing an example of a method of manufacturing the acoustic wave device according to the First Preferred Embodiment and illustrate a portion corresponding to a cross section taken along line I-I in FIG. 1.

As illustrated in FIG. 6A, the first conductor 17 and the second conductor 18 and a sacrificial layer 21 are simultaneously formed on a piezoelectric substrate 14A. In this example of a manufacturing method, the materials of the first conductor 17 and the second conductor 18 and the sacrificial layer 21 are the same. The first and second conductors 17 and 18 and the sacrificial layer 21 are provided so as to face each other with gaps therebetween. The first and second conductors 17 and 18 and the sacrificial layer 21 can be formed, for example, by using a sputtering method or a vacuum deposition method.

The material of the sacrificial layer 21 may be different from the material of the first and second conductors 17 and 18. In this case, the sacrificial layer 21, first conductor 17, and second conductor 18 may be provided in separate processes. For example, ZnO, SiO$_2$, Cu, or a resin can be used as the material of the sacrificial layer 21.

Next, as illustrated in FIG. 6B, the dielectric film 15 is formed so as to cover the first conductor 17, the second conductor 18, and the sacrificial layer 21. At this time, the partitions 15a are formed between the first and second conductors 17 and 18 and the sacrificial layer 21. As a result, the sacrificial layer 21 is positioned inside the central cavity 20A. The first conductor 17 is positioned inside the first lateral cavity 20B. The second conductor 18 is positioned inside the second lateral cavity 20C. The dielectric film 15 can be formed, for example, by using a sputtering method or a vacuum deposition method. Next, the dielectric film 15 is planarized. For example, a grinding or chemical mechanical polishing (CMP) method can be used when planarizing the dielectric film 15.

Next, the support substrate 16 is bonded to the dielectric film 15 as illustrated in FIG. 6C. Next, the main surface side of the piezoelectric substrate 14A where the support substrate 16 is not bonded is ground down or polished in order to reduce the thickness of the piezoelectric substrate 14A. For example, grinding, a CMP method, an ion slicing method, or an etching method can be used to adjust the thickness of the piezoelectric substrate 14A. Thus, as illustrated in FIG. 6D, the piezoelectric layer 14 is obtained. Through the processes described above, the piezoelectric substrate 12 in which the first conductor 17 is positioned inside the first lateral cavity 20B of the cavity is obtained. In the piezoelectric substrate 12, the second conductor 18 is positioned inside the second lateral cavity 20C.

Next, as illustrated in FIG. 7A, the IDT electrode 25 is formed on the first main surface 14a of the piezoelectric layer 14. The IDT electrode 25 is provided so that the first conductor 17 and the first busbar 26 face each other with the piezoelectric layer 14 interposed therebetween. The IDT electrode 25 is provided so that the second conductor 18 and the second busbar 27 face each other with the piezoelectric layer 14 interposed therebetween. The IDT electrode 25 can be formed using a sputtering method or a vapor deposition method, for example.

Next, the first through hole 14c, the second through hole 14d, the first through aperture 14e, and the second through aperture 14f illustrated in FIG. 1 are simultaneously provided in the piezoelectric layer 14. More specifically, as illustrated in FIG. 7A, the first through hole 14c is formed in the piezoelectric layer 14 so as to extend to the first conductor 17. The second through hole 14d is formed in the piezoelectric layer 14 so as to extend to the second conductor 18. As illustrated in FIG. 8A, the first through aperture 14e is formed in the piezoelectric layer 14 so as to extend to the sacrificial layer 21. Similarly, the second through aperture 14f is formed in the piezoelectric layer 14 so as to extend to the sacrificial layer 21. The first and second through holes 14c and 14d, and the first and second through apertures 14e and 14f can be formed using a reactive ion etching (RIE) method, for example.

Next, as illustrated in FIGS. 7B and 8A, the first lead-out wiring line 23 is formed in the first through hole 14c of the piezoelectric layer 14 and on the first main surface 14a of the piezoelectric layer 14.

At this time, the first lead-out wiring line 23 is provided so as to be connected to the first conductor 17 and so as to seal the first through hole 14c. Furthermore, as illustrated in FIG. 1, the first lead-out wiring line 23 is provided so as to be connected to the second electrode finger 29 positioned nearest the first through hole 14c. At the same time, the second lead-out wiring line 24 illustrated in FIG. 1 is formed inside the second through hole 14d and on the first main surface 14a. At this time, the second lead-out wiring line 24 is provided so as to be connected to the second conductor 18 and so as to seal the second through hole 14d. Furthermore, the second lead-out wiring line 24 is provided so as to be connected to the first electrode finger 28 positioned nearest the second through hole 14d. The first lead-out wiring line 23 and the second lead-out wiring line 24 can be formed, for example, by using a sputtering method or a vacuum deposition method.

Next, as illustrated in FIGS. 8A and 8B, the sacrificial layer 21 is removed by using the first through aperture 14e. At this time, the second through aperture 14f illustrated in FIG. 1 is also used at the same time to remove the sacrificial layer 21. More specifically, the sacrificial layer 21 inside the central cavity 20A of the dielectric film 15 is removed by allowing an etchant to flow through the first through aperture 14e and the second through aperture 14f.

As illustrated in FIG. 7B, the first conductor 17 is surrounded by the dielectric film 15, the piezoelectric layer 14, and the first lead-out wiring line 23. Similarly, the second conductor 18 is surrounded by the dielectric film 15, the piezoelectric layer 14, and the second lead-out wiring line 24. Therefore, the first conductor 17 and the second conductor 18 are not removed when the sacrificial layer 21 is removed.

Next, First to Third Modifications of the First Preferred Embodiment will be described. In the First to Third Modifications, the first conductor 17 and the first busbar 26 face each other with the piezoelectric layer 14 interposed therebetween, as in the First Preferred Embodiment. Therefore, the frequency characteristics and relative bandwidth can be easily adjusted without increasing the size of the acoustic wave device.

In the First Preferred Embodiment, the support 13 is a multilayer body including the support substrate 16 and the dielectric film 15. However, the configuration of the support 13 is not limited to this configuration.

Figure 9:
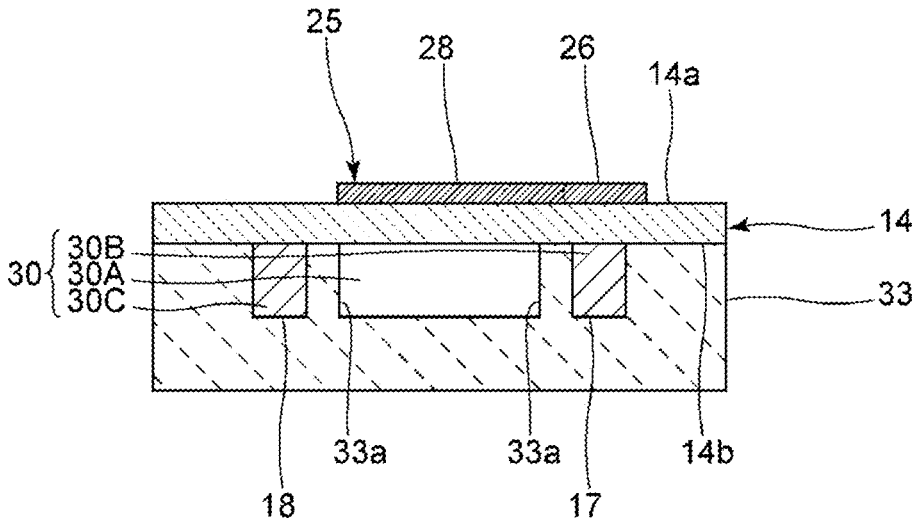
FIG. 9 is a sectional view of an acoustic wave device according to a First Modification of the First Preferred Embodiment of the present invention and illustrates a portion corresponding to a cross section taken along line II-II in FIG. 1.
Figure 10:
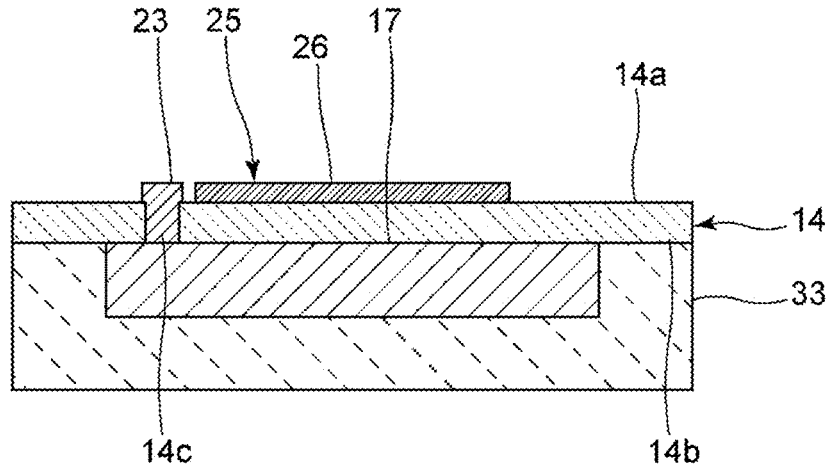
FIG. 10 is a sectional view of the acoustic wave device according to the First Modification of the First Preferred Embodiment of the present invention and illustrates a portion corresponding to a cross section taken along line III-III in FIG. 1.

For example, in the First Modification of the First Preferred Embodiment illustrated in FIG. 9 and FIG. 10, a support 33 includes only a support substrate. As illustrated in FIG. 9, a cavity 30 of the support 33 includes a center cavity 30A, a first lateral cavity 30B, and a second lateral cavity 30C. In this modification, the cavity 30 is a recess provided in the support substrate. The support substrate includes a pair of partitions 33a. However, the support substrate does not have to include the partitions 33a. The first conductor 17 is provided on the second main surface 14b of the piezoelectric layer 14 and is in contact with the bottom of the first lateral cavity 30B.

To obtain the acoustic wave device of this modification, a recess may be provided in the support substrate by using a RIE method, for example. This allows the cavity 30 to be formed in the support substrate as the support 33. The central cavity 30A, the first lateral cavity 30B, and the second lateral cavity 30C can be formed by performing masking as appropriate using, for example, photolithography or other methods. Next, the first conductor 17 is formed inside the first lateral cavity 30B. At the same time, the second conductor 18 is formed inside the second lateral cavity 30C. After that, the piezoelectric substrate may then be bonded to the support 33. Alternatively, the first conductor 17 and the second conductor 18 may be formed on the piezoelectric substrate. The piezoelectric substrate may then be bonded to the support 33 so that the first conductor 17 is positioned inside the first lateral cavity 30B and the second conductor 18 is positioned inside the second lateral cavity 30C. For example, direct bonding, plasma-activated bonding, or atomic diffusion bonding can be used to bond the support substrate, defining and functioning as the support 33, and the piezoelectric substrate to each other. The steps after this point can be performed in the same or substantially the same manner as in the example of the method of manufacturing the acoustic wave device 10 according to the First Preferred Embodiment described above.

Figure 11:
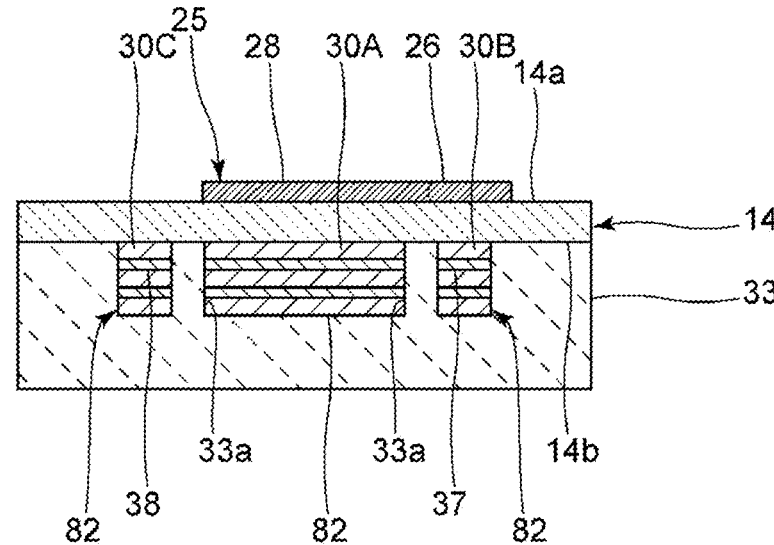
FIG. 11 is a sectional view of an acoustic wave device according to a Second Modification of the First Preferred Embodiment of the present invention and illustrates a portion corresponding to a cross section taken along line II-II in FIG. 1.

In the First Preferred Embodiment and the First Modification, the cavity is an energy confinement layer. More specifically, the central cavity is an energy confinement layer. The energy confinement layer is stacked on the piezoelectric layer, and as a result, the energy of acoustic waves is effectively confined to the piezoelectric layer. However, the energy confinement layer is not limited to being the cavity. For example, the energy confinement layer may be an acoustic multilayer film 82 as in a Second Modification of the First Preferred Embodiment illustrated in FIG. 11.

Figure 12:
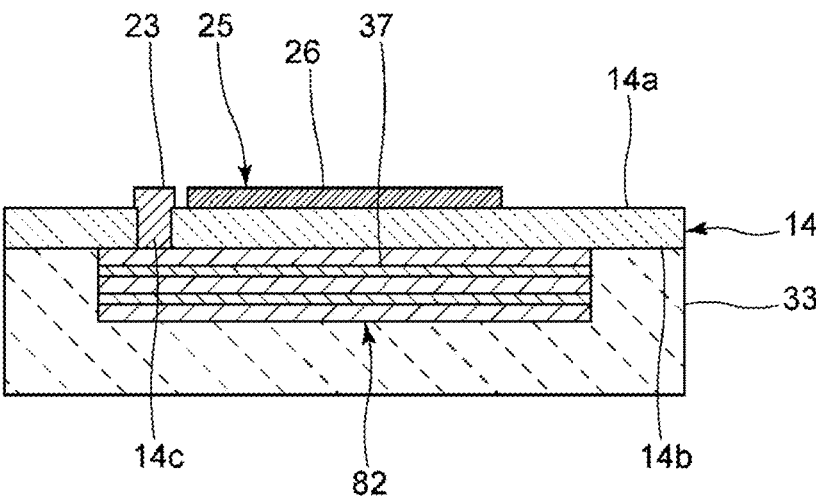
FIG. 12 is a sectional view of the acoustic wave device according to the Second Modification of the First Preferred Embodiment of the present invention and illustrates a portion corresponding to a cross section taken along line III-III in FIG. 1.

In this modification, the acoustic multilayer film 82 is provided not only in the center cavity 30A, but also in the first lateral cavity 30B and the second lateral cavity 30C. As described in detail below, the acoustic multilayer film 82 is a multilayer film including a plurality of acoustic impedance layers. The acoustic multilayer film 82 of this modification includes at least one acoustic impedance layer made of a metal. The acoustic impedance layers made of a metal include a first conductor 37 and a second conductor 38. The first conductor 37 may be indirectly provided on the second main surface 14b of the piezoelectric layer 14 with an acoustic impedance layer including a dielectric interposed therebetween. As illustrated in FIG. 12, the first conductor 37 may face the first busbar 26 with the acoustic impedance layer, which is made of a dielectric, and the piezoelectric layer 14 interposed therebetween. Similarly, the second conductor 38 may also face the second busbar 27 with the acoustic impedance layer, which is made of a dielectric, and the piezoelectric layer 14 interposed therebetween.

Figure 13:
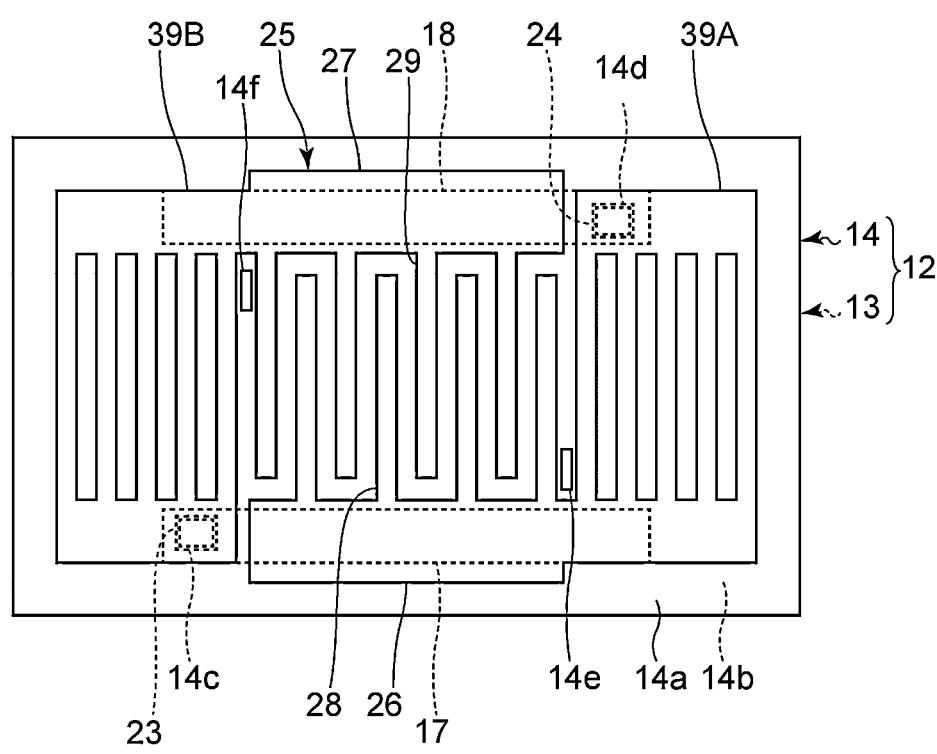
FIG. 13 is a plan view of an acoustic wave device according to a Third Modification of the First Preferred Embodiment of the present invention.

As described above, in a preferred embodiment of the present invention, the acoustic wave device may be configured to use plate waves. For example, in the Third Modification of the First Preferred Embodiment illustrated in FIG. 13, a pair of reflectors 39A and 39B is provided on the first main surface 14a of the piezoelectric layer 14 on both sides of the IDT electrode 25 in the electrode finger facing direction. This enables the resonance characteristics to be suitably improved when plate waves are used.

In this modification, the second busbar 27 is connected to the reflector 39B. Therefore, the reflector 39B is connected to the same potential as the second busbar. In this modification, the first through hole 14c overlaps the reflector 39B in plan view. Furthermore, the first lead-out wiring line 23 is provided inside the first through hole 14c so as to connect the reflector 39B and the first conductor 17 to each other. Thus, the first conductor 17 is electrically connected to the second busbar 27. However, the first through hole 14c does not have to overlap the reflector 39B in plan view. The reflector 39B does not need to be connected to the second busbar 27. The first conductor 17 and the second busbar 27 may be electrically connected to each other using the same or substantially the same configuration as in the First Preferred Embodiment.

On the other hand, the first busbar 26 is connected to the reflector 39A. Therefore, the reflector 39A is connected to the same potential as the first busbar 26. In this modification, the second through hole 14d overlaps the reflector 39A in plan view. Furthermore, the second lead-out wiring line 24 is provided inside the second through hole 14d so as to connect the reflector 39A and the second conductor 18 to each other. Thus, the second conductor 18 is connected to the same potential as the first busbar 26. However, the second through hole 14d does not have to overlap the reflector 39A in plan view. The reflector 39A does not need to be connected to the first busbar 26. The second conductor 18 and the first busbar 26 may be electrically connected to each other using the same or substantially the same configuration as in the First Preferred Embodiment.

In this modification, the first through aperture 14e and the second through aperture 14f are provided between the reflectors and the IDT electrode 25. However, the first through aperture 14e may be provided, for example, at a position so that the reflector 39A is interposed between the first through aperture 14e and the IDT electrode 25. The second through aperture 14f may be provided, for example, at a position so that the reflector 39B is interposed between the second through aperture 14f and the IDT electrode 25.

Hereafter, an acoustic wave device that utilizes thickness-shear mode bulk waves is described in detail.

Figure 14A:
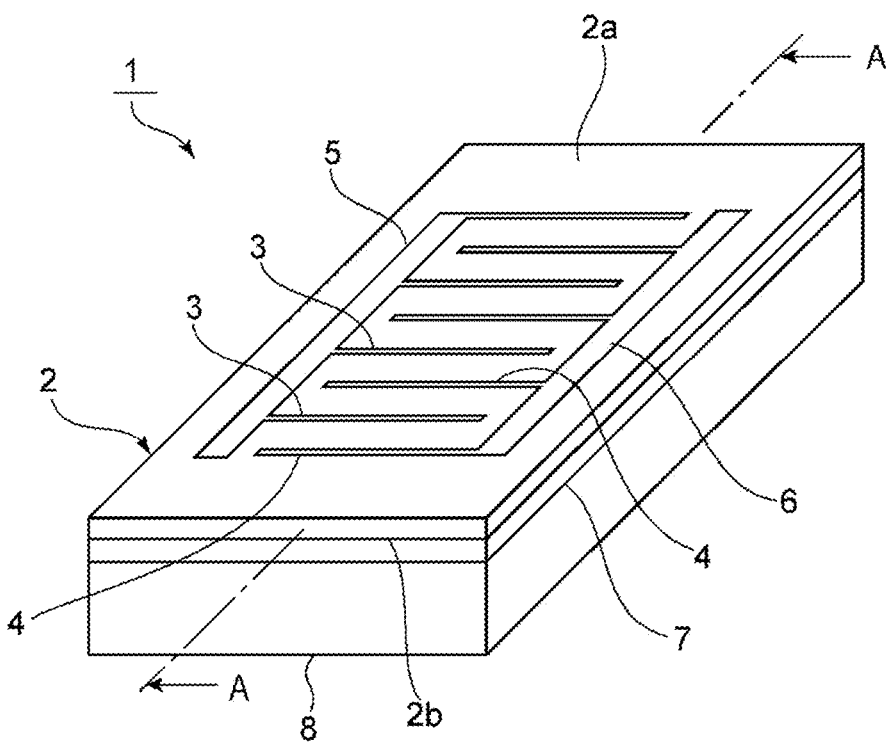
FIG. 14A is a schematic perspective view illustrating the exterior of a filter device using thickness-shear mode bulk waves.
Figure 14B:
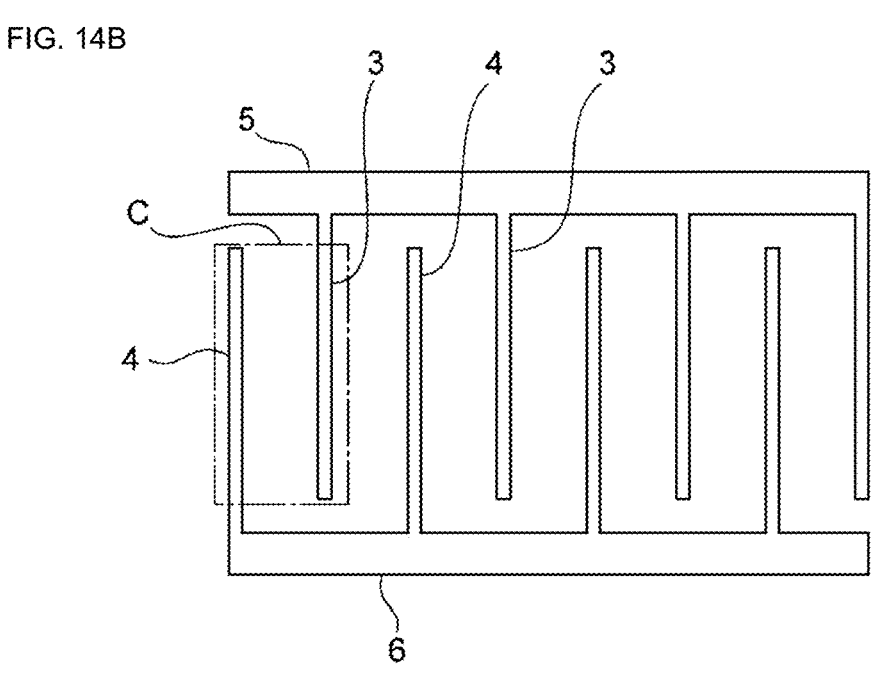
FIG. 14B is a plan view illustrating the electrode structure on a piezoelectric layer.
Figure 15:
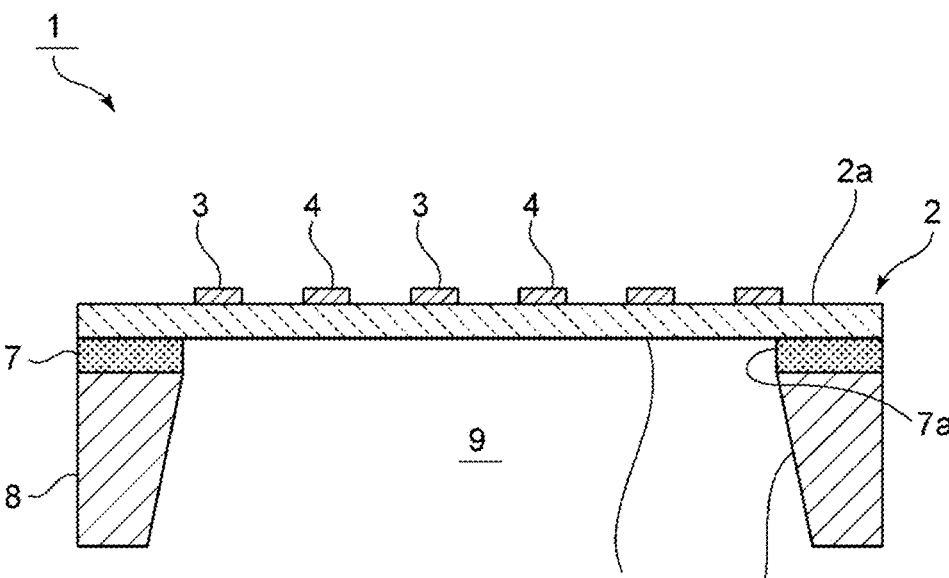
FIG. 15 is a sectional view taken along line A-A in FIG. 14A.

FIG. 14A is a schematic perspective view illustrating the exterior of an acoustic wave device using thickness-shear mode bulk waves. FIG. 14B is a plan view illustrating the electrode structure on a piezoelectric layer. FIG. 15 is a sectional view taken along line A-A in FIG. 14A.

An acoustic wave device 1 includes a piezoelectric layer 2 made of, for example, $LiNbO_3$. The piezoelectric layer 2 may instead be made of, for example, $LiTaO_3$. The cut angle of $LiNbO_3$ and $LiTaO_3$ is a Z-cut angle, but may instead be a rotated Y-cut or X-cut angle. The thickness of the piezoelectric layer 2 is not particularly limited, but is preferably, for example, greater than or equal to about 40 nm and less than or equal to about 1000 nm, and more preferably greater than or equal to about 50 nm and less than or equal to about 1000 nm in order to effectively excite a thickness-shear mode. The piezoelectric layer 2 includes first and second main surfaces 2a and 2b, which face each other. Electrodes 3 and electrodes 4 are provided on the first main surface 2a. In FIGS. 14A and 14B, a plurality of electrodes 3 are connected to a first busbar 5. A plurality of electrodes 4 are connected to a second busbar 6. The plurality of electrodes 3 and the plurality of electrodes 4 are interdigitated with each other. The electrodes 3 and 4 are rectangular or substantially rectangular in shape and include a longitudinal direction. An electrode 3 and an adjacent electrode 4 face each other in a direction perpendicular or substantially perpendicular to the longitudinal direction. An IDT electrode includes the multiple electrodes 3 and 4, and the first and second busbars 5 and 6. Both the longitudinal direction of the electrodes 3 and 4 and the direction perpendicular or substantially perpendicular to the longitudinal direction of the electrodes 3 and 4 intersect the thickness direction of the piezoelectric layer 2. Therefore, the electrode 3 and the adjacent electrode 4 can be said to face each other in a direction that intersects the thickness direction of the piezoelectric layer 2. The longitudinal direction of the electrodes 3 and 4 may be interchanged with a direction perpendicular or substantially perpendicular to the longitudinal direction of the electrodes 3 and 4 illustrated in FIGS. 14A and 14B. In other words, in FIGS. 14A and 14B, the electrodes 3 and 4 may extend in the direction in which the first busbar 5 and second busbar 6 extend. In this case, the first busbar 5 and second busbar 6 would extend in the direction in which electrodes 3 and 4 extend in FIGS. 14A and 14B. A pair structure including an electrode 3 connected to one potential and an electrode 4 connected to another potential that are adjacent to each other, and a plurality of the pair structure are provided in a direction perpendicular or substantially perpendicular to the longitudinal direction of the electrodes 3 and 4. Here, an electrode 3 and an electrode 4 are adjacent to each other does not mean that the electrode 3 and the electrode 4 are disposed so as to be in direct contact with each other, but rather that the electrode 3 and the electrode 4 are disposed with a spacing therebetween. When an electrode 3 and an electrode 4 are adjacent to each other, no electrodes connected to a hot electrode or a ground electrode, including other electrodes 3 and 4, are disposed between the electrodes 3 and 4. The number of pairs does not have to be an integer number of pairs, and may be 1.5 pairs, 2.5 pairs, and so on. The distance between the centers of the electrodes 3 and 4, i.e., the pitch is preferably, for example, greater than or equal to about 1 μm and less than or equal to about 10 μm. The width of the electrodes 3 and 4, i.e., the dimension in the direction in which the electrodes 3 and 4 face each other is preferably, for example, in a range greater than or equal to about 50 nm and less than or equal to about 1000 nm, and more preferably in a range greater than or equal to about 150 nm and less than or equal to about 1000 nm. The distance between centers of the electrodes 3 and 4 is the distance between the center of the dimension (width dimension) of the electrode 3 in a direction perpendicular to the longitudinal direction of the electrode 3 and the center of the dimension (width dimension) of the electrode 4 in a direction perpendicular or substantially perpendicular to the longitudinal direction of the electrode 4.

Since a Z-cut piezoelectric layer is used in the acoustic wave device 1, the direction perpendicular or substantially perpendicular to the longitudinal direction of the electrodes 3 and 4 is perpendicular or substantially perpendicular to the polarization direction of the piezoelectric layer 2. This is not the case if a piezoelectric layer of another cut angle is used as the piezoelectric layer 2. Here, "perpendicular" is not limited to meaning strictly perpendicular, and can also mean substantially perpendicular (the angle between the direction perpendicular to the longitudinal direction of the electrodes 3 and 4 and the polarization direction may lie within a range of about 90°±10° for example).

A support 8 is stacked on the second main surface 2b side of the piezoelectric layer 2 with an insulating layer 7 interposed therebetween. The insulating layer 7 and the support 8 have a frame shape and include through holes 7a and 8a as illustrated in FIG. 15. In this way, a cavity 9 is provided. The cavity 9 is provided so as not to interfere with the vibration of an excitation region C of the piezoelectric layer 2. Therefore, the support 8 is stacked on the second main surface 2b with the insulating layer 7 interposed therebetween at a position where the support 8 does not overlap a portion where at least a pair of electrodes 3 and 4 is provided. The insulating layer 7 does not need to be provided. Thus, the support 8 can be directly or indirectly stacked on the second main surface 2b of the piezoelectric layer 2.

The insulating layer 7 is made of, for example, silicon oxide. However, in addition to silicon oxide, other suitable insulating materials such as, for example, about silicon oxynitride and alumina can be used. The support 8 is made of, for example, Si. The plane orientation of Si on the piezoelectric layer 2 side may be (100) or (110), or even (111). The Si of the support 8 preferably has a high resistivity of, for example, about 4 kΩ or more. However, the support 8 may also include an appropriate insulating or semiconductor material.

For example, a piezoelectric material such as aluminum oxide, lithium tantalate, lithium niobate, or quartz, any of various ceramic materials such as alumina, magnesia, sapphire, silicon nitride, aluminum nitride, silicon carbide, zirconia, cordierite, mullite, steatite, or forsterite, a dielectric material such as diamond or glass, or a semiconductor such as gallium nitride can be used as the material of the support 8.

The plurality of electrodes 3 and 4 and the first and second busbars 5 and 6 are made of a suitable metal or alloy such as, for example, Al or an AlCu alloy. In the present preferred embodiment, the electrodes 3 and 4 and first and second busbars 5 and 6 have a structure, for example, in which an Al film is stacked on a Ti film. An adhesive layer other than a Ti film may be used.

When driving is performed, an AC voltage is applied between the plurality of electrodes 3 and the plurality of electrodes 4. More specifically, an AC voltage is applied between the first busbar 5 and the second busbar 6. In this way, resonance characteristics can be obtained using thickness-shear mode bulk waves excited in the piezoelectric layer 2. In the acoustic wave device 1, when d represents the thickness of the piezoelectric layer 2 and p represents the distance between the centers of any adjacent electrodes 3 and 4 out of the plurality of pairs of electrodes 3 and 4, d/p is, for example, less than or equal to about 0.5. Therefore, bulk waves of a thickness-shear mode are effectively excited and good resonance characteristics can be obtained. More preferably, d/p is, for example, less than or equal to about 0.24, and in this case, even better resonance characteristics can be obtained.

As a result of the acoustic wave device 1 having the above configuration, even if the number of pairs of the electrodes 3 and 4 is reduced in order to facilitate miniaturization, the Q value is unlikely to fall. This is because even if the number of electrode fingers in the reflectors on both sides is reduced, there is little propagation loss. The number of electrode fingers can be reduced because bulk waves of a thickness-shear mode are used. The difference between Lamb waves and thickness-shear mode bulk waves utilized in acoustic wave devices will be described while referring to FIGS. 16A and 16B.

Figure 16A:
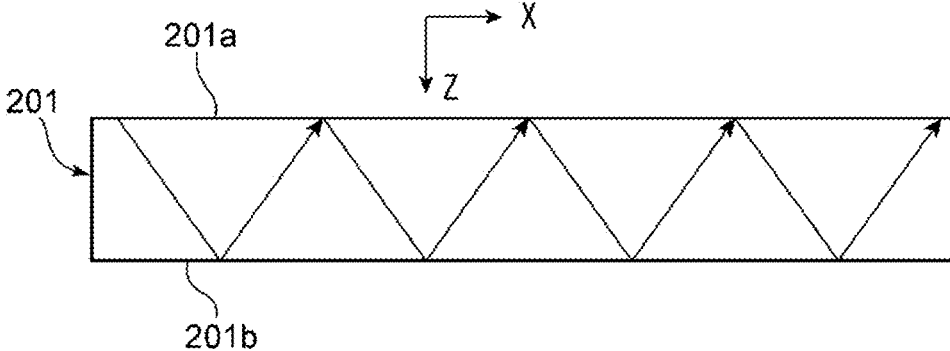
FIG. 16A is a schematic elevational cross-sectional view for describing a Lamb wave propagating through a piezoelectric film in an acoustic wave device.

FIG. 16A is a schematic elevational cross-sectional view for illustrating Lamb waves propagating through a piezoelectric film of an acoustic wave device as described in Japanese Unexamined Patent Application Publication No. 2012-257019. Here, a wave propagates through a piezoelectric film 201 as illustrated by the arrows. In the piezoelectric film 201, a first main surface 201a and a second main surface 201b are opposite each other, and the thickness direction connecting the first main surface 201a and the second main surface 201b is a Z direction. An X direction is the direction in which the electrode fingers of the IDT electrode are arrayed. As illustrated in FIG. 16A, a Lamb wave propagates in the X direction, as illustrated in the figure. The entire piezoelectric film 201 vibrates because plate waves are used and the waves propagate in the x direction, and therefore reflectors are disposed on both sides in order to obtain resonance characteristics. Therefore, wave propagation loss occurs, and when size reduction is attempted, i.e., when the number of pairs of electrode fingers is reduced, the Q value falls.

Figure 16B:
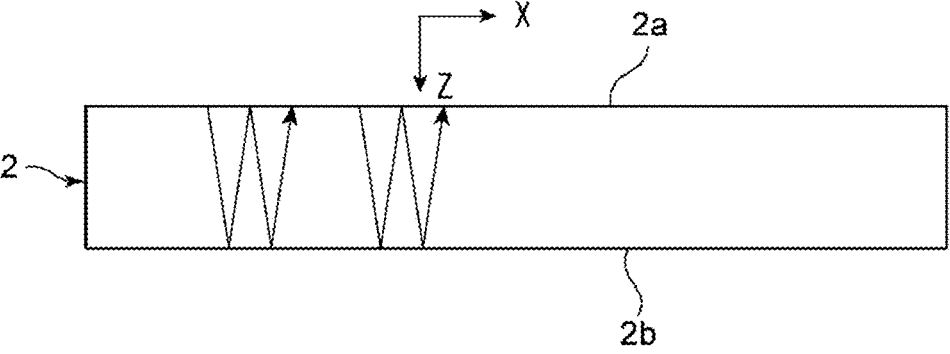
FIG. 16B is a schematic elevational cross-sectional view for describing a thickness-shear mode bulk wave propagating through a piezoelectric film in an acoustic wave device.

In contrast, as illustrated in FIG. 16B, in the acoustic wave device 1, vibration displacement occurs in the thickness shear direction, and therefore the waves propagate and resonate substantially in a direction connecting the first and second main surfaces 2a and 2b of the piezoelectric layer 2 to each other, i.e., the Z direction. In other words, the x-direction component of the waves is significantly smaller than the z-direction component of the waves. Since resonance characteristics are obtained by propagation of waves in the Z direction, propagation loss is unlikely to occur even if the number of electrode fingers of the reflectors is reduced. Furthermore, even if the number of pairs of electrodes including the electrodes 3 and 4 is reduced in order to facilitate size reduction, the Q value is unlikely to decrease.

Figure 17:
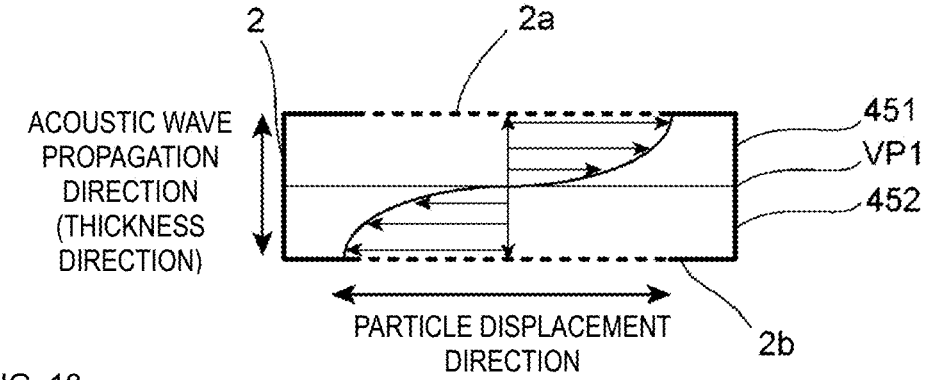
FIG. 17 illustrates the amplitude direction of a bulk wave in a thickness-shear mode.

Bulk waves of the thickness-shear mode have opposite amplitude directions in a first region 451, which is included in an excitation region C of the piezoelectric layer 2, and in a second region 452, which is included in the excitation region C, as illustrated in FIG. 17. In FIG. 17, the bulk wave is illustrated in a schematic manner for a case where a voltage is applied between an electrode 3 and an electrode 4, with the electrode 4 being at a higher potential than the electrode 3. The first region 451 is a region of the excitation region C between a virtual plane VP1, which is perpendicular or substantially perpendicular to the thickness direction of the piezoelectric layer 2 and divides the piezoelectric layer 2 into two regions, and the first main surface 2a. The second region 452 is the region of the excitation region C between the virtual plane VP1 and the second main surface 2b.

As described above, at least one pair of electrodes consisting of an electrode 3 and an electrode 4 is disposed in the acoustic wave device 1. However, since the waves do not propagate in the X direction, there does not need to be a plurality of pairs of electrodes including the electrodes 3 and 4. In other words, at least one pair of electrodes is all that is required.

For example, the electrode 3 is an electrode connected to a hot potential and the electrode 4 is an electrode connected to the ground potential. However, the electrodes 3 may be connected to the ground potential and the electrodes 4 may be connected to the hot potential. In the present preferred embodiment, at least one pair of electrodes including an electrode connected to a hot potential and an electrode connected to the ground potential, as described above, and no floating electrodes are provided.

Figure 18:
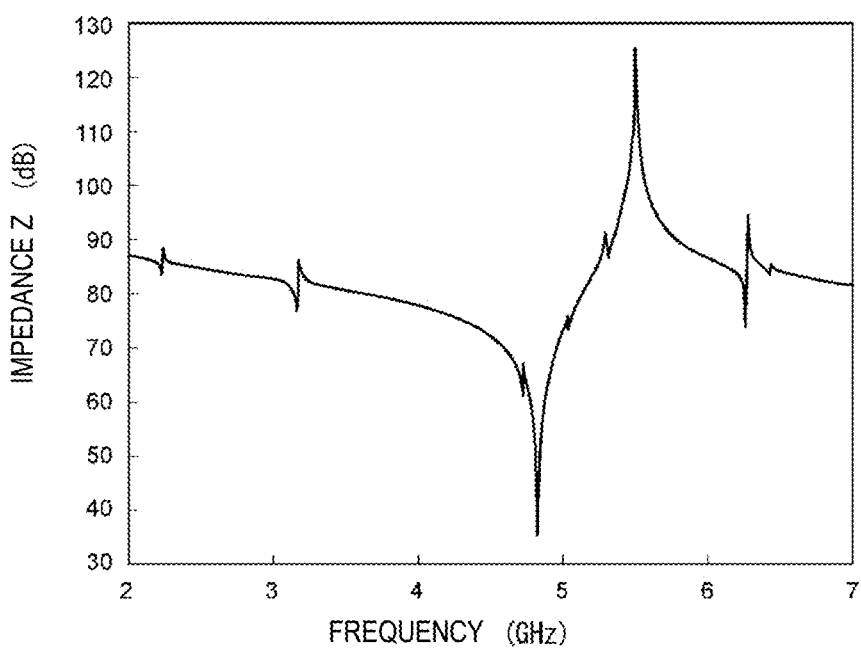
FIG. 18 illustrates the resonance characteristics of an acoustic wave device that uses thickness-shear mode bulk waves.

FIG. 18 illustrates the resonance characteristics of the acoustic wave device illustrated in FIG. 15. The design parameters of the acoustic wave device 1 with which these resonances characteristics were obtained are as follows.

Piezoelectric layer 2: LiNbO$_3$ with Euler angles (about 0°, about 0°, about 90°), thickness=about 400 nm.

When viewed in a direction perpendicular or substantially perpendicular to the longitudinal direction of the electrodes 3 and 4, the length of the region where the electrodes 3 and 4 overlap, i.e., the length of the excitation region C=about 40 μm, the number of pairs of electrodes consisting of the electrodes 3 and 4=21 pairs, the distance between the centers of the electrodes=about 3 μm, the width of the electrodes 3 and 4=about 500 nm, d/p=about 0.133.

Insulating layer 7: about 1 μm thick silicon oxide film. Support 8: Si.

The length of the excitation region C is the dimension along the longitudinal direction of the electrodes 3 and 4 in the excitation region C.

In the present preferred embodiment, the distance between electrodes of the electrode pairs the electrodes 3 and 4 is equal or substantially equal in all of the plurality of pairs. In other words, the electrodes 3 and 4 are disposed at a uniform or substantially uniform pitch.

It is clear from FIG. 18 that good resonance characteristics with a relative bandwidth of about 12.5% are obtained despite there being no reflectors.

Incidentally, when d represents the thickness of the piezoelectric layer 2 and p represents the distance between the centers of the electrodes 3 and 4, in the present preferred embodiment, d/p is, for example, less than or equal to about 0.5, and more preferably, for example, less than or equal to about 0.24, as described above. This will be described with reference to FIG. 19.

Figure 19:
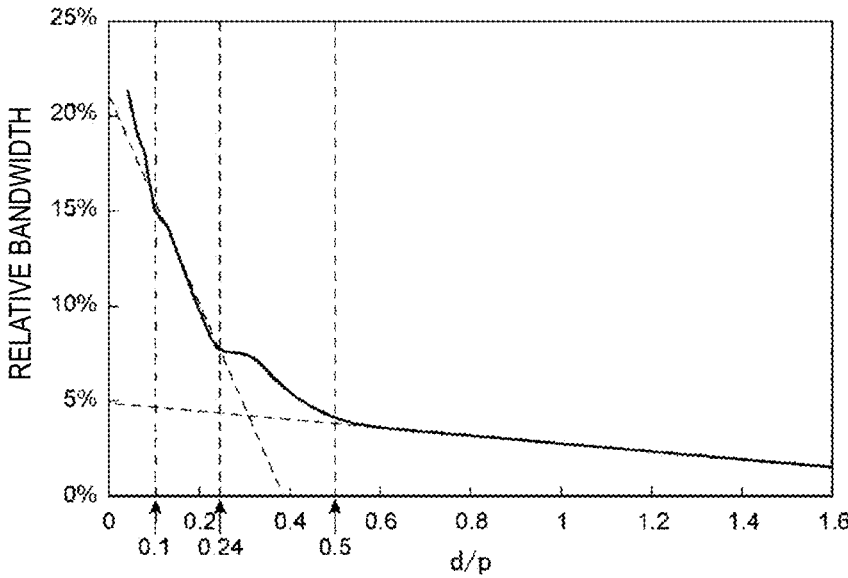
FIG. 19 illustrates the relationship between d/p and the relative bandwidth of a resonator when p is the distance between the centers of adjacent electrodes and d is the thickness of a piezoelectric layer.

A plurality of acoustic wave devices were obtained in the same or substantially the same manner as the resonance device in which the resonance characteristics illustrated in FIG. 18 were obtained except that d/p was varied. FIG. 19 illustrates the relationship between d/p and the relative bandwidth of an acoustic wave device serving as a resonator.

As is clear from FIG. 19, for d/p>about 0.5, the relative bandwidth is less than about 5%, even when d/p is adjusted. In contrast, when d/p about 0.5, if d/p is varied within this range, the relative bandwidth can be set to about 5% or more, i.e., a resonator with a high coupling coefficient can be configured. In addition, when d/p is about 0.24 or less, the relative bandwidth can be increased to about 7% or more. In addition, if d/p is adjusted within this range, a resonator with an even wider relative bandwidth can be obtained and a resonator with an even higher coupling coefficient can be realized.

Therefore, it is clear that a resonator using thickness-shear mode bulk waves and has a high coupling coefficient can be configured by setting d/p to about 0.5 or less.

Figure 20:
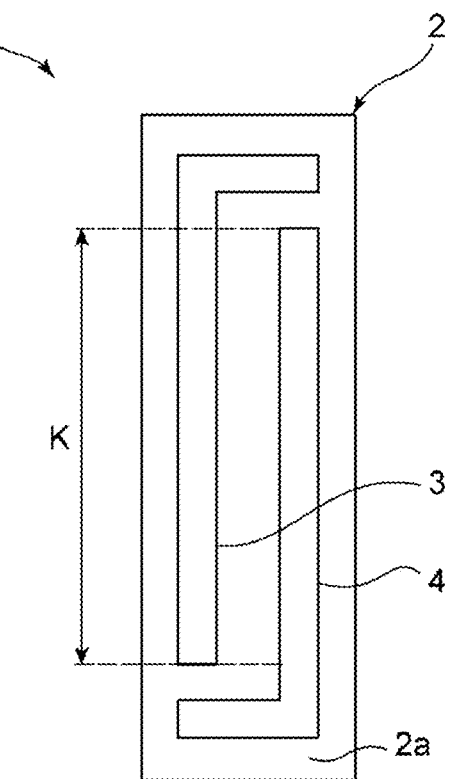
FIG. 20 is a plan view of an acoustic wave device that uses thickness-shear mode bulk waves.

FIG. 20 is a plan view of an acoustic wave device that uses thickness-shear mode bulk waves. In an acoustic wave device 80, one pair of electrodes, consisting of an electrode 3 and an electrode 4, is provided on the first main surface 2a of the piezoelectric layer 2. K in FIG. 20 indicates the crossing width. As described above, the acoustic wave device according to a preferred embodiment of the present invention may include one pair of electrodes. In this case, as long as d/p is about 0.5 or less, bulk waves of the thickness-shear mode can be effectively excited.

Figure 21:
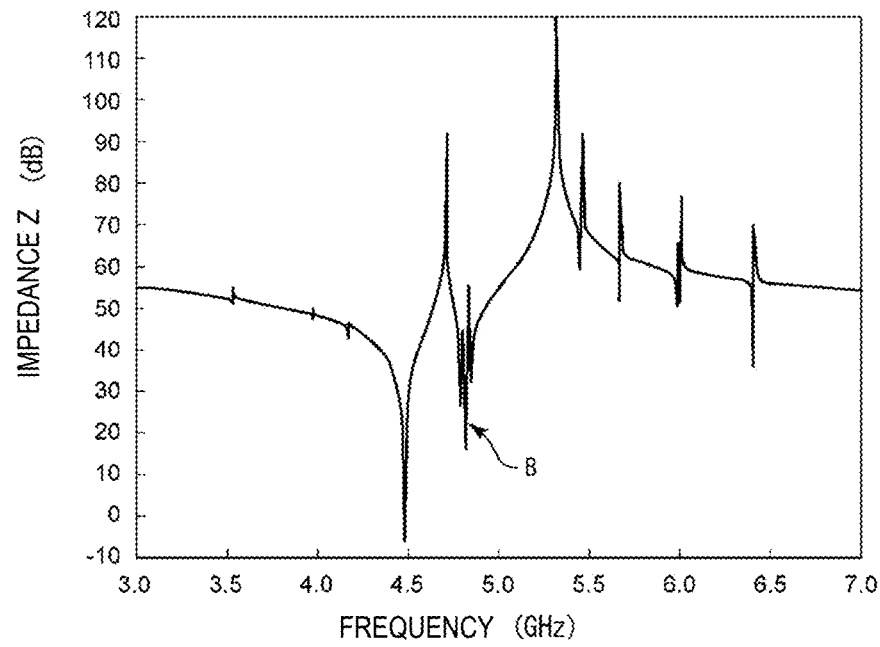
FIG. 21 illustrates the resonance characteristics of an acoustic wave device of a reference example in which spurious responses appear.

In the acoustic wave device 1, a metallization ratio MR of adjacent electrodes 3 and 4 with respect to the excitation region C, which is the region in which any adjacent electrodes 3 and 4 of the plurality of electrodes 3 and 4 overlap in the direction in which the electrodes 3 and 4 face each other, preferably satisfies MR≤about 1.75 (d/p)+0.075. In this case, spurious responses can be effectively reduced or prevented. This will be explained with reference to FIGS. 21 and 22. FIG. 21 is a reference diagram illustrating an example of the resonance characteristics of the acoustic wave device 1. A spurious response, as indicated by arrow B, appears between a resonant frequency and an anti-resonant frequency. Note that d/p=about 0.08 and Euler angles (about 0°, about 0°, about 90°) of LiNbO$_3$ were assumed. The metallization ratio MR=about 0.35 was used.

The metallization ratio MR will be described while referring to FIG. 14B. Focusing on one pair of electrodes 3 and 4, it is assumed that only one pair of electrodes 3 and 4 is provided in the electrode structure in FIG. 14B. In this case, the region surrounded by a single dot dashed line is the excitation region C. This excitation region C includes the region of the electrode 3 that overlaps the electrode 4, the region of electrode 4 that overlaps the electrode 3, and the region between the electrode 3 and the electrode 4 where the electrode 3 and the electrode 4 overlap, when the electrode 3 and the electrode 4 are viewed in a direction perpendicular or substantially perpendicular to the longitudinal direction of the electrodes 3 and 4. The metallization ratio MR is the ratio of the area of electrodes 3 and 4 within the excitation region C to the area of the excitation region C. That is, the metallization ratio MR is the ratio of the area of the metallization portion to the area of the excitation region C.

When a plurality of pairs of electrodes are provided, MR may be the ratio of the metallization portions included in the total excitation region to the total area of the excitation region.

Figure 22:
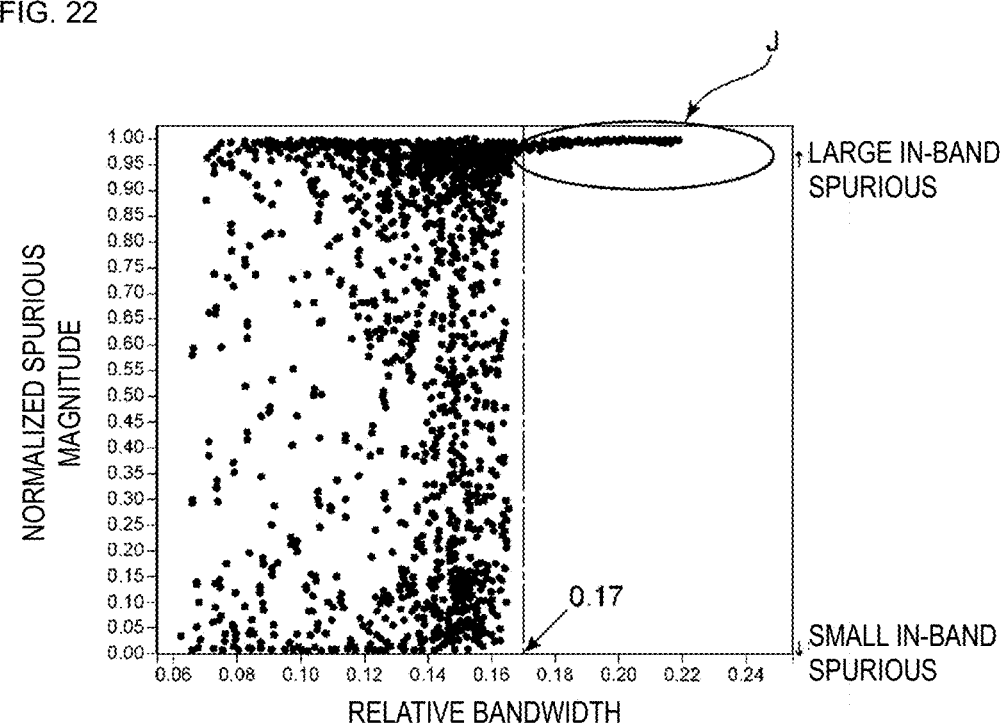
FIG. 22 illustrates the relationship between the relative bandwidth and the amount of phase rotation of the impedance of spurious responses normalized using 180 degrees as the magnitude of the spurious.

FIG. 22 illustrates the relationship between the relative bandwidth and the amount of phase rotation of the impedance of spurious normalized using 180 degrees as the magnitude of the spurious response when a number of acoustic wave resonators are configured according to the present preferred embodiment. The relative bandwidth was adjusted by changing the film thickness of the piezoelectric layer and the dimensions of the electrodes to various values. FIG. 21 illustrates results for a piezoelectric layer composed of Z-cut $LiNbO_3$, but a similar trend is observed for piezoelectric layers with other cut angles.

In the region enclosed by an oval J in FIG. 22, the spurious response is as large as about 1.0. It is clear from FIG. 22 that when the relative bandwidth exceeds about 0.17, i.e., about 17%, large spurious responses of about 1 or more appear inside the passband, even when the parameters used to achieve the relative bandwidth are varied. In other words, a large spurious response, as indicated by arrow B, appears inside the band as in the resonance characteristics illustrated in FIG. 21. Therefore, the relative bandwidth is preferably about 17% or less.

In this case, the spurious response can be reduced by adjusting the film thickness of the piezoelectric layer 2 and the dimensions of the electrodes 3 and 4.

Figures 23, 24:
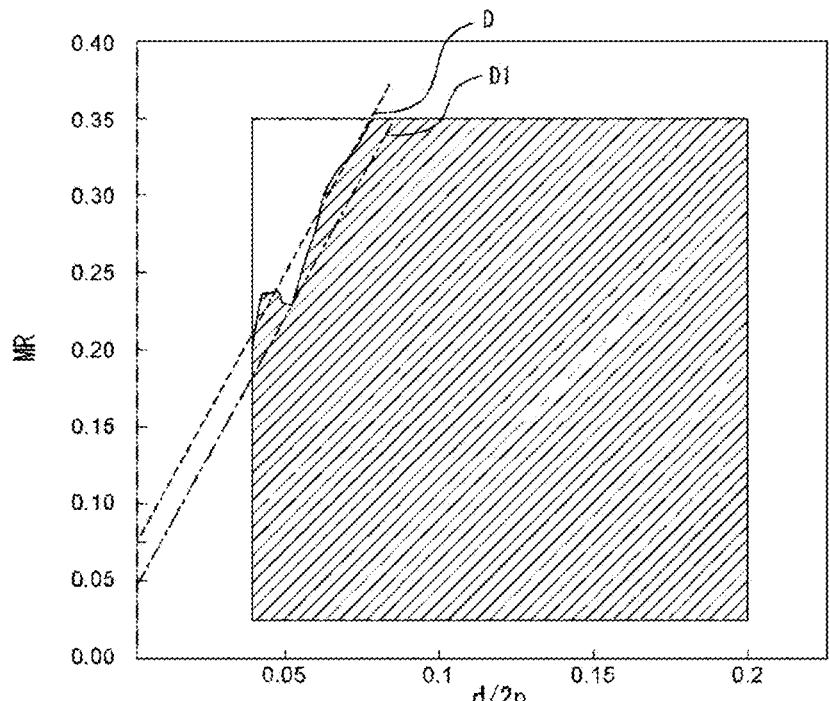
FIG. 23 illustrates the relationship between d/2p and a metallization ratio MR.
FIG. 24 illustrates a relative bandwidth map for the Euler angles ($0°$, $\theta$, $\Psi$) of $LiNbO_3$ when d/p is as close to 0 as possible.

FIG. 23 illustrates the relationship between d/2p, the metallization ratio MR, and the relative bandwidth. For the above acoustic wave device, various acoustic wave devices with different d/2p and MR were configured and the relative bandwidths were measured. The area shaded with hatching on the right side of a dashed line D in FIG. 23 is the region where the relative bandwidth is about 17% or less. The boundary between the region shaded with hatching and the region not shaded with hatching is expressed as MR=about 3.5(d/2p)+0.075. That is, MR=about 1.75(d/p)+0.075. Therefore, preferably, MR≤about 1.75(d/p)+0.075. In this case, the relative bandwidth is easily made about 17% or less. The region to the right of MR=about 3.5(d/2p)+0.05 indicated by a single dot dashed line D1 in FIG. 23 is more preferable. In other words, if MR≤about 1.75(d/p)+0.05, the relative bandwidth will reliably be about 17% or less.

FIG. 24 illustrates a relative bandwidth map for the Euler angles (0°, θ, Ψ) of $LiNbO_3$ when d/p is as close to 0 as possible. The areas shaded with hatching in FIG. 24 are regions where a relative bandwidth of at least 5% or more can be obtained, and the ranges of these regions can be approximated by the following Formulas (1), (2), and (3).

$$(0°±10°, 0° \text{ to } 20°, \text{any } \Psi) \qquad (1)$$

$$(0°±10°, 20° \text{ to } 80°, 0° \text{ to } 60°(1-(\theta-50)^2/900)^{1/2}) \text{ or } \\ (0°±10°, 20° \text{ to } 80°, [180°-60°(1-(\theta-50)^2/ \\ 900)^{1/2}]\text{~}180° \qquad (2)$$

$$(0°±10°, [180°-30°(1-(\Psi-90)^2/8100)^{1/2}]\text{~}180°, \text{any} \\ \Psi) \qquad (3)$$

Therefore, the Euler angle range of Formula (1), (2) or (3) is preferable because this allows the relative bandwidth to be made sufficiently wide. This is also the case when the piezoelectric layer 2 is a lithium tantalate layer.

Figure 25:
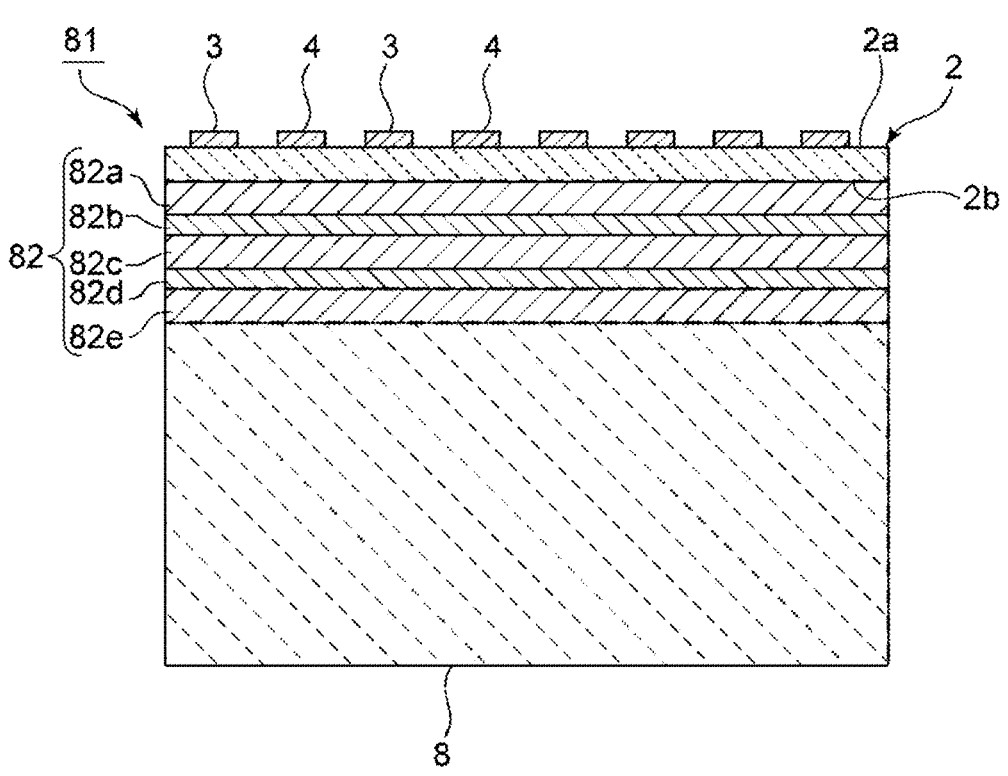
FIG. 25 is an elevational cross-sectional view of an acoustic wave device including an acoustic multilayer film according to a preferred embodiment of the present invention.

FIG. 25 is an elevational cross-sectional view of an acoustic wave device including an acoustic multilayer film according to a preferred embodiment of the present invention. In an acoustic wave device 81, the acoustic multilayer film 82 is stacked on the second main surface 2b of the piezoelectric layer 2. The acoustic multilayer film 82 has a multilayer structure including low acoustic impedance layers 82a, 82c, and 82e, which have a relatively low acoustic impedance, and high acoustic impedance layers 82b and 82d, which have a relatively high acoustic impedance. When the acoustic multilayer film 82 is used, thickness-shear mode bulk waves can be confined within the piezoelectric layer 2 without the use of the cavity 9 in the acoustic wave device 1. In the acoustic wave device 81, resonance characteristics based on thickness-shear mode bulk waves can be obtained by setting d/p to, for example, be about 0.5 or less. In the acoustic multilayer film 82, the number of low acoustic impedance layers 82a, 82c, and 82e and high acoustic impedance layers 82b, 82d is not particularly limited. It is sufficient that at least one high acoustic impedance layer 82b or 82d be disposed farther from the piezoelectric layer 2 than the low acoustic impedance layers 82a, 82c, or 82e is.

The low acoustic impedance layers 82a, 82c, and 82e and the high acoustic impedance layers 82b and 82d can be made of appropriate materials as long as the above acoustic impedance relationship is satisfied.

For example, the material of the low acoustic impedance layers 82a, 82c, and 82e may be silicon oxide or silicon oxynitride. The material of the high acoustic impedance layers 82b and 82d may be alumina, silicon nitride, or a metal.

Figure 26:
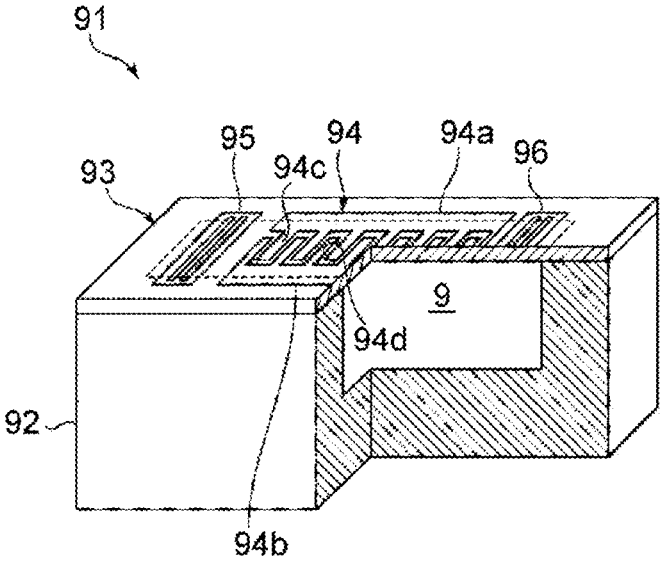
FIG. 26 is a partial cutout perspective view for describing an acoustic wave device that uses Lamb waves.

FIG. 26 is a partial cutout perspective view for describing an acoustic wave device according to a preferred embodiment of the present invention that uses Lamb waves.

An acoustic wave device 91 includes a support substrate 92. An open recess is provided in the top surface of the support substrate 92. A piezoelectric layer 93 is stacked on the support substrate 92. Thus, a cavity 9 is provided. An IDT electrode 94 is provided on the piezoelectric layer 93 above the cavity 9. Reflectors 95 and 96 are provided on both sides of the IDT electrode 94 in an acoustic wave propagation direction. In FIG. 26, the outer edge of the cavity 9 is indicated by a dashed line. Here, the IDT electrode 94 includes first and second busbars 94a and 94b, a plurality of first electrode fingers 94c, and a plurality of second electrode fingers 94d. The plurality of first electrode fingers 94c are connected to the first busbar 94a. The plurality of second electrode fingers 94d are connected to the second busbar 94b. The plurality of first electrode fingers 94c and the plurality of second electrode fingers 94d are interdigitated with each other.

In the acoustic wave device 91, Lamb waves are excited as plate waves by applying an AC electric field to the IDT electrode 94 above the cavity 9. Since the reflectors 95 and 96 are provided on both sides, resonance characteristics produced by Lamb waves can be obtained.

Thus, an acoustic wave device according to a preferred embodiment of the present invention may use plate waves.

For the piezoelectric substrates of the acoustic wave devices of the First Preferred Embodiment and each modification that use bulk waves of the thickness-shear mode, it is preferable that d/p is, for example, about 0.5 or less and more preferably about 0.24 or less, as described above. This enables even better resonance characteristics to be obtained. Furthermore, in the acoustic wave devices of the First Preferred Embodiment and each modification that use bulk waves of the thickness-shear mode, it is preferable that MR≤about 1.75(d/p)+0.075 be satisfied, as described above. In this case, spurious responses can be more reliably suppressed.

In the acoustic wave devices of the First Preferred Embodiment and each modification that use bulk waves of the thickness-shear mode, the piezoelectric layer is preferably, for example, a lithium niobate layer or a lithium tantalate layer. The Euler angles (φ, θ, Ψ) of the lithium niobate or lithium tantalate of the piezoelectric layer preferably lie in the range defined by Formula (1), (2), or (3) given above. In this case, the relative bandwidth can be made sufficiently wide.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric layer including a first main surface and a second main surface that face each other;
an IDT electrode on the first main surface of the piezoelectric layer and including a first busbar and a second busbar that face each other, and a plurality of electrode fingers;
a first conductor on the second main surface of the piezoelectric layer and facing the first busbar with the piezoelectric layer interposed therebetween;
a second conductor on the second main surface of the piezoelectric layer and facing the second busbar with the piezoelectric layer interposed therebetween; and
a support on the second main surface of the piezoelectric layer and supporting the piezoelectric layer; wherein
a cavity that opens towards the piezoelectric layer is provided in the support;
the first conductor is positioned inside the cavity;
an electric potential of the first conductor is different from an electric potential to which the first busbar is connected;
the second conductor is positioned inside the cavity;
a potential of the second conductor is different from a potential to which the second busbar is connected; and
a capacitor is defined by the second conductor, the second busbar, and the piezoelectric layer.

2. The acoustic wave device according to claim 1, wherein a capacitor is defined by the first conductor, the first busbar, and the piezoelectric layer.

3. The acoustic wave device according to claim 1, wherein the support includes a support substrate and a dielectric film between the support substrate and the piezoelectric layer.

4. The acoustic wave device according to claim 1, wherein the support includes only a support substrate.

5. The acoustic wave device according to claim 1, wherein the piezoelectric layer is a lithium niobate layer or a lithium tantalate layer.

6. An acoustic wave device comprising:
a piezoelectric layer including a first main surface and a second main surface that face each other;
an IDT electrode on the first main surface of the piezoelectric layer and including a first busbar and a second busbar that face each other, and a plurality of electrode fingers;
a conductor on the second main surface of the piezoelectric layer and facing the first busbar with the piezoelectric layer interposed therebetween; and a support on the second main surface of the piezoelectric layer and supporting the piezoelectric layer; wherein
a cavity that opens towards the piezoelectric layer is provided in the support;
the conductor is positioned inside the cavity;
an electric potential of the conductor is different from an electric potential to which the first busbar is connected;
a through hole is provided in the piezoelectric layer; and
the acoustic wave device further includes a lead-out wiring line connected to the conductor and extending through the through hole.

7. The acoustic wave device according to claim 6, wherein the lead-out wiring line is electrically connected to the second busbar.

8. The acoustic wave device according to claim 7, wherein the conductor is a first conductor;
the acoustic wave device further includes a second conductor on the second main surface of the piezoelectric layer and facing the second busbar with the piezoelectric layer interposed therebetween;
the second conductor is positioned inside the cavity;
a potential of the second conductor is different from a potential to which the second busbar is connected;
a capacitor is defined by the second conductor, the second busbar, and the piezoelectric layer;
the through hole is a first through hole and the lead-out wiring line is a first lead-out wiring line;
a second through hole is provided in the piezoelectric layer; and
the acoustic wave device further includes a second lead-out wiring line connected to the second conductor and extending through the second through hole.

9. The acoustic wave device according to claim 8, wherein the second lead-out wiring line is electrically connected to the first busbar.

10. An acoustic wave device comprising:
a piezoelectric layer including a first main surface and a second main surface that face each other;
an IDT electrode on the first main surface of the piezoelectric layer and including a first busbar and a second busbar that face each other, and a plurality of electrode fingers;
a conductor on the second main surface of the piezoelectric layer and facing the first busbar with the piezoelectric layer interposed therebetween; and
a support on the second main surface of the piezoelectric layer and supporting the piezoelectric layer; wherein
a cavity that opens towards the piezoelectric layer is provided in the support;
the conductor is positioned inside the cavity;
an electric potential of the conductor is different from an electric potential to which the first busbar is connected;
the cavity includes a central cavity overlapping the plurality of electrode fingers in plan view and a lateral cavity overlapping the first busbar in plan view and positioned at a side of the central cavity; and
the conductor is positioned inside the lateral cavity.

11. The acoustic wave device according to claim 10, wherein the lateral cavity is a cavity including a bottom.

12. The acoustic wave device according to claim 11, wherein the conductor is provided inside an entirety or substantially an entirety of the cavity.

13. The acoustic wave device according to claim 10, wherein
the conductor is a first conductor;
the acoustic wave device further includes a second conductor on the second main surface of the piezoelectric layer and facing the second busbar with the piezoelectric layer interposed therebetween;

the second conductor is positioned inside the cavity;

a potential of the second conductor is different from a potential to which the second busbar is connected;

a capacitor is defined by the second conductor, the second busbar, and the piezoelectric layer;

the lateral cavity is a first lateral cavity;

the cavity includes a second lateral cavity overlapping the second busbar in plan view and positioned at a side of the central cavity; and the second conductor is positioned inside the second lateral cavity.

14. The acoustic wave device according to claim 1, wherein the acoustic wave device is operable to generate plate waves.

15. The acoustic wave device according to claim 1, wherein the acoustic wave device is operable to generate thickness-shear mode bulk waves.

16. The acoustic wave device according to claim 1, wherein d/p is about 0.5 or less, when d is a thickness of the piezoelectric layer and p is a distance between centers of adjacent electrode fingers among the electrode fingers.

17. The acoustic wave device according to claim 16, wherein d/p is about 0.24 or less.

18. The acoustic wave device according to claim 16, wherein when an excitation region is a region where the adjacent electrode fingers overlap when viewed in a direction in which the electrode fingers face each other and MR is a metallization ratio of the plurality of electrode fingers to the excitation region, MR≤about 1.75 (d/p)+0.075 is satisfied.

19. The acoustic wave device according to claim 15, wherein the piezoelectric layer is a lithium niobate layer or a lithium tantalate layer, and Euler angles ($\phi$, $\theta$, $\Psi$) of the lithium niobate or lithium tantalate of the piezoelectric layer lie within a range of Formula (1), (2), or (3):

$$(0°\pm10°, 0° \text{ to } 20°, \text{ any } \Psi) \qquad \text{Formula (1)};$$

$$(0°\pm10°, 20° \text{ to } 80°, 0° \text{ to } 60° (1-(\theta-50)^2/900)^{1/2}) \text{ or}$$
$$(0°\pm10°, 20° \text{ to } 80°, [180°-60° (1-(\theta-50)^2/900)^{1/2}]\sim180° \qquad \text{Formula (2); and}$$

$$(0°\pm10°, [180°-30° (1-(\Psi-90)^2/8100)^{1/2}]\sim180°, \text{ any } \Psi) \qquad \text{Formula (3)}.$$

20. An acoustic wave device manufacturing method for manufacturing the acoustic wave device according to claim 1, the method comprising:

obtaining a piezoelectric substrate in which the support and the piezoelectric layer are stacked, the first conductor being positioned inside the cavity; and providing the IDT electrode on the first main surface of the piezoelectric layer so that the first conductor and the first busbar face each other with the piezoelectric layer interposed therebetween.

21. The acoustic wave device manufacturing method according to claim 20, wherein the support includes a support substrate and a dielectric film;

the obtaining the piezoelectric substrate includes providing the first conductor and a sacrificial layer on the piezoelectric layer, providing the dielectric film on the piezoelectric layer so as to cover the first conductor and the sacrificial layer, bonding the dielectric film and the support substrate to each other, providing a through aperture in the piezoelectric layer, the through aperture extending to the sacrificial layer, and removing the sacrificial layer by using the through aperture.

22. The acoustic wave device manufacturing method according to claim 21, wherein in the providing the first conductor and the sacrificial layer on the piezoelectric layer, the first conductor and the sacrificial layer face each other with a gap therebetween; and in the providing the dielectric film, a partition is provided between the first conductor and the sacrificial layer, the partition being a portion of the dielectric film.

23. The acoustic wave device manufacturing method according to claim 21, wherein in the providing the through aperture, a through hole that extends to the first conductor is further provided;

the method further comprising:

providing a lead-out wiring line so that the lead-out wiring line is connected to the first conductor and seals the through hole; wherein the removing the sacrificial layer is performed after the providing the lead-out wiring line.

24. The acoustic wave device manufacturing method according to claim 22, wherein the first conductor and the sacrificial layer are made of a same material.

* * * * *